US010056298B2

(12) United States Patent
Kawai

(10) Patent No.: US 10,056,298 B2
(45) Date of Patent: Aug. 21, 2018

(54) MANUFACTURING METHOD OF SEMICONDUCTOR DEVICE

(71) Applicant: Renesas Electronics Corporation, Koutou-ku, Tokyo (JP)

(72) Inventor: Tohru Kawai, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/687,444

(22) Filed: Aug. 26, 2017

(65) Prior Publication Data

US 2018/0090382 A1 Mar. 29, 2018

(30) Foreign Application Priority Data

Sep. 29, 2016 (JP) .................................. 2016-190875

(51) Int. Cl.
*H01L 21/8234* (2006.01)
*H01L 21/8238* (2006.01)
(Continued)

(52) U.S. Cl.
CPC ................ *H01L 21/823418* (2013.01); *H01L 21/823481* (2013.01); *H01L 21/823814* (2013.01);
(Continued)

(58) Field of Classification Search
CPC ..... H01L 21/823418; H01L 21/823481; H01L 21/823814; H01L 21/823835; H01L 27/0629
See application file for complete search history.

(56) References Cited

U.S. PATENT DOCUMENTS

2005/0227440 A1* 10/2005 Ema ................ H01L 21/823857
438/275
2006/0261398 A1* 11/2006 Lee ................... H01L 21/28282
257/314

(Continued)

FOREIGN PATENT DOCUMENTS

JP 2007-258463 A 10/2007

OTHER PUBLICATIONS

M. Raman, et al., "Physical Model for the Resistivity and Temperature Coefficient of Resistivity in Heavily Doped Polysilicon," IEEE Transactions on Electron Devices, vol. 53, No. 8, Aug. 2006, pp. 1885-1892.

*Primary Examiner* — Christine Enad
(74) *Attorney, Agent, or Firm* — Shapiro, Gabor and Rosenberger, PLLC

(57) ABSTRACT

A manufacturing method of a semiconductor device comprises a step of ion-implanting a P-type impurity at a first dose amount to form semiconductor regions that are low concentration semiconductor regions of a high breakdown voltage P-type transistor, and a step of ion-implanting a P-type impurity at a second dose amount to form P⁻ semiconductor regions that are low concentration semiconductor regions of a low breakdown voltage P-type transistor and form a P-type impurity layer that is a resistance portion of a polysilicon resistor. The manufacturing method further comprises a resistance portion forming step in which a resistance portion of the polysilicon resistor is made thinner than terminal portions at both ends of the resistance portion, and the second dose amount is larger than the first dose amount.

15 Claims, 20 Drawing Sheets

(51) Int. Cl.
*H01L 27/06* (2006.01)
*H01L 29/45* (2006.01)

(52) U.S. Cl.
CPC .. *H01L 21/823835* (2013.01); *H01L 27/0629* (2013.01); *H01L 29/456* (2013.01)

(56) References Cited

U.S. PATENT DOCUMENTS

| | | |
|---|---|---|
| 2007/0221995 A1 | 9/2007 | Suzuki et al. |
| 2010/0148262 A1* | 6/2010 | Stahrenberg ........ H01L 27/0629 257/350 |
| 2010/0289080 A1* | 11/2010 | Wei ................. H01L 21/823807 257/347 |
| 2011/0266637 A1* | 11/2011 | Lee .................... H01L 27/0629 257/410 |
| 2015/0187757 A1* | 7/2015 | Chung .............. H01L 21/76224 257/380 |

* cited by examiner

MANUFACTURING METHOD OF SEMICONDUCTOR DEVICE

CROSS-REFERENCE TO RELATED APPLICATION

The present application claims priority from Japanese Patent Application No. 2016-190875 filed on Sep. 29, 2016, the content of which is hereby incorporated by reference into this application.

TECHNICAL FIELD OF THE INVENTION

The present invention relates to a manufacturing method of a semiconductor device, for example, a technique effectively applied to a manufacturing method of a semiconductor device including a high breakdown voltage MISFET, a low breakdown voltage MISFET and a resistance element.

BACKGROUND OF THE INVENTION

Japanese Unexamined Patent Application Publication No. 2007-258463 (Patent Document 1) discloses a semiconductor device including a high breakdown voltage MISFET, a low breakdown voltage MISFET and a polysilicon resistor.

"Physical Model for the Resistivity and Temperature Coefficient of Resistivity in Heavily Doped Polysilicon" IEEE TRANSACTIONS ON ELECTRON DEVICES, VOL. 53, NO. 8, AUGUST 2006, pp. 1885-1892 (Non-Patent Document 1) discloses a temperature dependence of a polysilicon resistor.

SUMMARY OF THE INVENTION

The semiconductor device studied by the inventor of the present application has a high breakdown voltage MISFET, a low breakdown voltage MISFET and a resistance element. The high breakdown voltage MISFET includes a high breakdown voltage N-type transistor and a high breakdown voltage P-type transistor, and the low breakdown voltage MISFET includes a low breakdown voltage N-type transistor and a low breakdown voltage P-type transistor.

Each of the high breakdown voltage N-type transistor, the high breakdown voltage P-type transistor, the low breakdown voltage N-type transistor and the low breakdown voltage P-type transistor has a gate electrode, a source region and a drain region, and each of the source region and the drain region has an LDD (Lightly Doped Drain) structure comprised of a low concentration semiconductor region and a high concentration semiconductor region. Then, an impurity concentration of the low concentration semiconductor region of the high breakdown voltage N-type transistor or the high breakdown voltage P-type transistor is lower than that of the low concentration semiconductor region of the low breakdown voltage N-type transistor or the low breakdown voltage P-type transistor.

In addition, the resistance element is a polysilicon resistor, and a resistance value thereof (for example, sheet resistance) is set by introducing an impurity with a desired impurity concentration into a polycrystalline silicon film. For the miniaturization of the resistance element, it is important to use a polysilicon resistor having a high sheet resistance, and the resistance element is formed by using, for example, an impurity implantation process for forming the low concentration semiconductor region of the high breakdown voltage P-type transistor.

However, the study by the inventor of the present application has revealed that, since the temperature dependence of the polysilicon resistor increases as the impurity concentration of the polysilicon resistor becomes lower, an analog circuit or the like including the resistance element tends to malfunction and the reliability of the semiconductor device including the analog circuit is deteriorated.

Namely, the improvement in reliability is desired in the semiconductor device including a polysilicon resistor, or the improvement in performance of the semiconductor device is desired. Alternatively, the improvement in reliability and performance of the semiconductor device is desired.

The other problems and novel characteristics of the present invention will be apparent from the description of the present specification and the accompanying drawings.

According to one embodiment, a manufacturing method of a semiconductor device comprises a step of ion-implanting a P-type impurity at a first dose amount to form $P^-$ semiconductor regions that are low concentration semiconductor regions of a high breakdown voltage P-type transistor, and a step of ion-implanting a P-type impurity at a second dose amount to form $P^-$ semiconductor regions that are low concentration semiconductor regions of a low breakdown voltage P-type transistor and form a P-type impurity layer that is a resistance portion of a polysilicon resistor. The manufacturing method further comprises a resistance portion forming step in which a resistance portion of the polysilicon resistor is made thinner than terminal portions at both ends of the resistance portion, and the second dose amount is larger than the first dose amount.

According to one embodiment, it is possible to improve the reliability of the semiconductor device or the performance of the semiconductor device. Alternatively, it is possible to improve the reliability and performance of the semiconductor device.

BRIEF DESCRIPTIONS OF THE DRAWINGS

DESCRIPTIONS OF THE PREFERRED EMBODIMENTS

Figure 1:
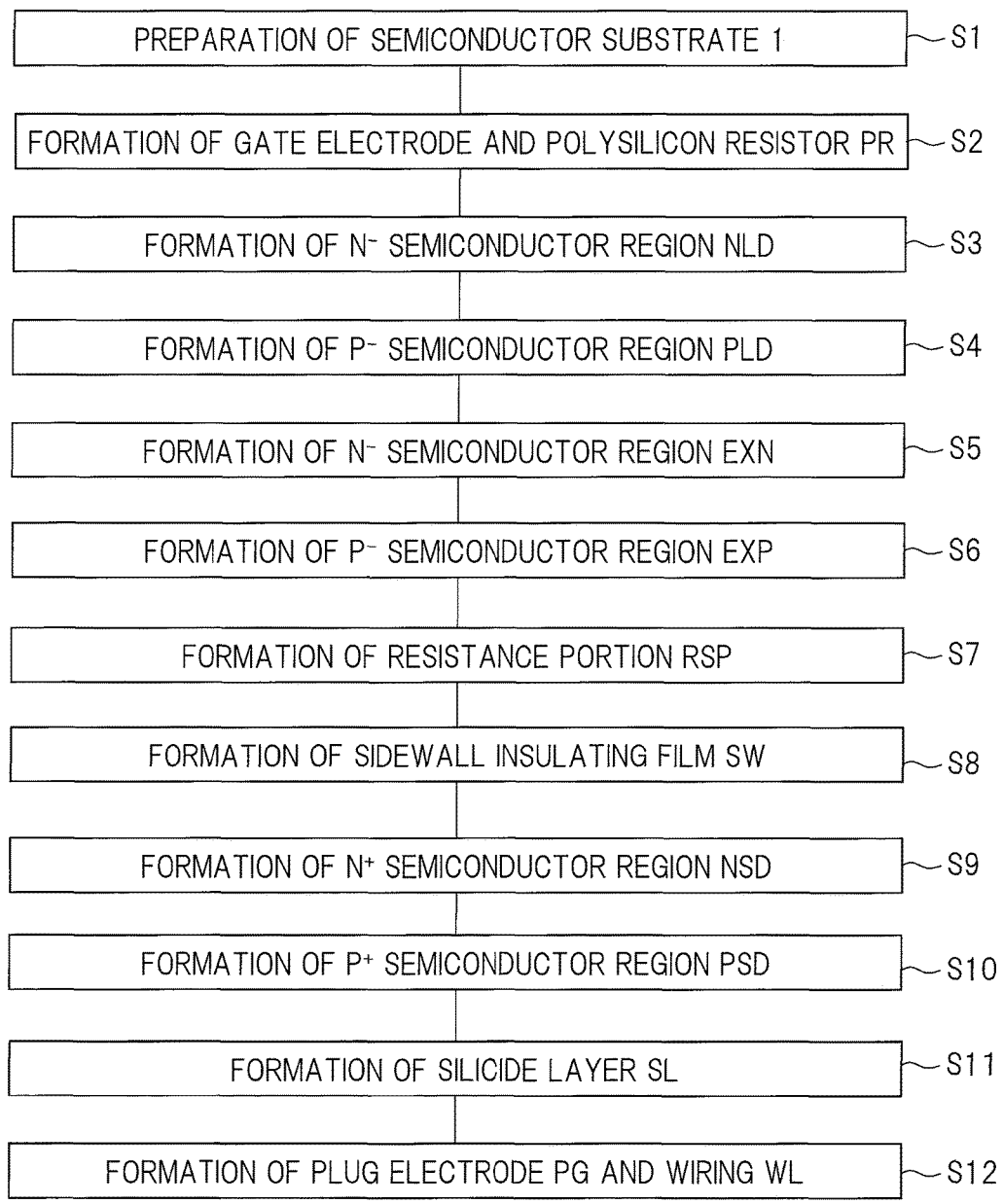
FIG. 1 is a process flow diagram showing a part of a manufacturing process of a semiconductor device according to a first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps and the like) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, the same components are denoted by the same reference characters throughout the drawings for describing the embodiments, and the repetitive description thereof will be omitted.

First Embodiment

<Structure of Semiconductor Device>

Figure 13:
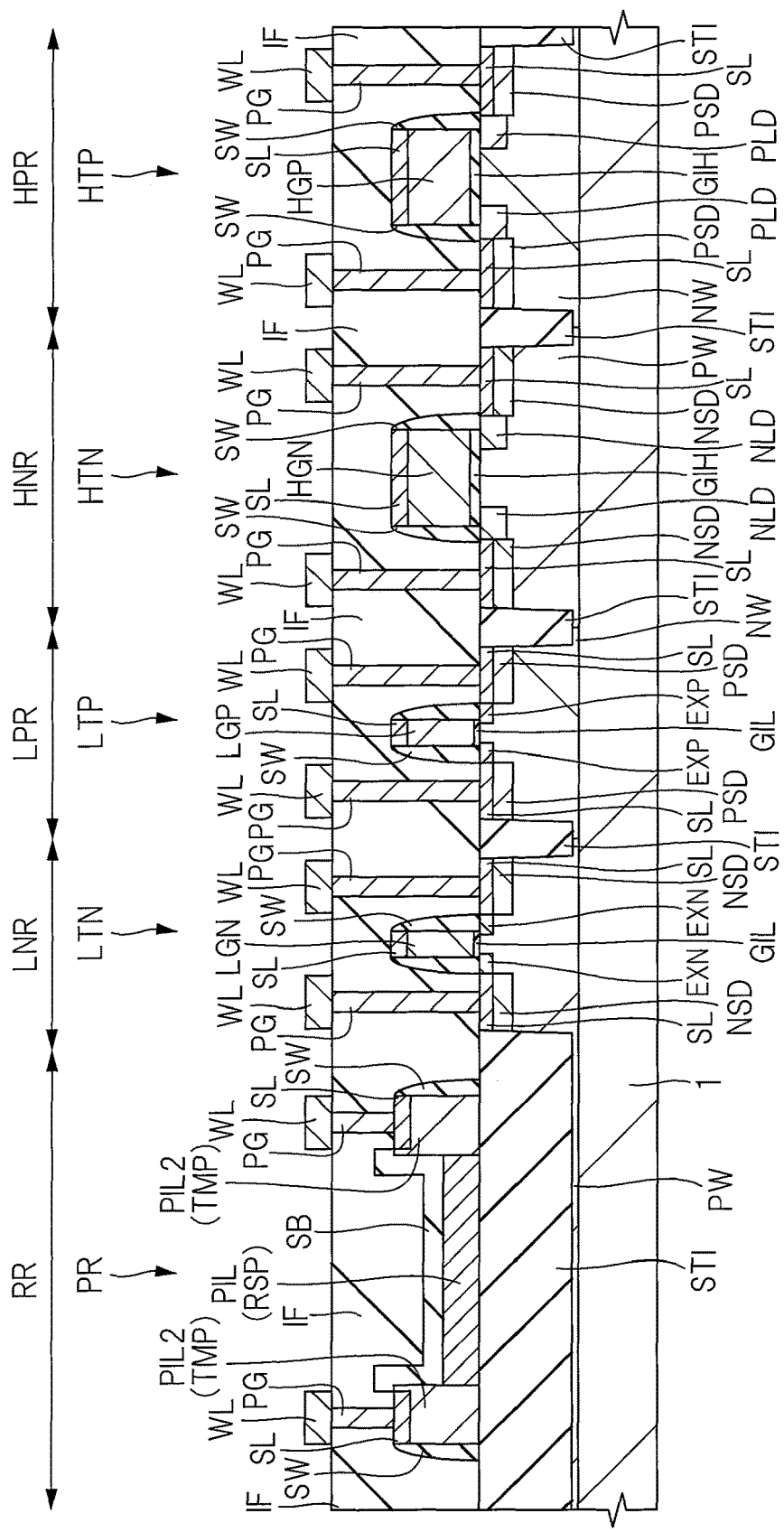
FIG. 13 is a cross-sectional view showing a principal part of the semiconductor device according to the first embodiment.

FIG. 13 is a cross-sectional view showing a principal part of a semiconductor device according to the present embodiment. The semiconductor device has a low breakdown voltage N-type transistor LTN, a low breakdown voltage P-type transistor LTP, a high breakdown voltage N-type transistor HTN, a high breakdown voltage P-type transistor HTP, and a polysilicon resistor (resistance element) PR. Low breakdown voltage transistors such as the low breakdown voltage N-type transistor LTN and the low breakdown voltage P-type transistor LTP are used to configure a logic circuit, and high breakdown voltage transistors such as the high breakdown voltage N-type transistor HTN and the high breakdown voltage P-type transistor HTP and the polysilicon resistor PR are used to configure an analog circuit.

An operating power supply voltage of the low breakdown voltage N-type transistor LTN and the low breakdown voltage P-type transistor LTP is, for example, 1 V or lower, and an operating power supply voltage of the high breakdown voltage N-type transistor HTN and the high breakdown voltage P-type transistor HTP is, for example, 5 V or higher. The operating power supply voltage of the high breakdown voltage N-type transistor HTN and the high breakdown voltage P-type transistor HTP is higher than the operating power supply voltage of the low breakdown voltage N-type transistor LTN and the low breakdown voltage P-type transistor LTP. The transistors mentioned above are, for example, MISFETs (Metal Insulator Semiconductor Field Effect Transistors).

The semiconductor device is formed on a p-type semiconductor substrate 1 made of silicon or the like. Note that a semiconductor substrate having an SOI (Silicon On insulator) structure may be used as the semiconductor substrate 1. In a main surface of the semiconductor substrate 1, a plurality of P-type well regions PW and a plurality of N-type well regions NW are formed, and the P-type well region PW and the N-type well region NW have a desired depth (for example, 0.3 μm to 0.4 μm from the main surface of the semiconductor substrate 1 in a depth direction of the semiconductor substrate 1. The low breakdown voltage N-type transistor LTN and the high breakdown voltage N-type transistor HTN are formed in the P-type well region PW and the low breakdown voltage P-type transistor LTP and the high breakdown voltage P-type transistor HTP are formed in the N-type well region NW. Although the polysilicon resistor PR is formed in the P-type well region PW, it may be formed in the N-type well region NW.

In addition, in the main surface of the semiconductor substrate 1, an element isolation region (element isolation film) STI made of an insulating film (insulating material) is formed, and an active region which is a part of the main surface of the semiconductor substrate 1 is surrounded by the element isolation region STI. A plurality of the active regions surrounded by the element isolation region STI are formed in the main surface of the semiconductor substrate 1. The active region serves as a region in which the transistor mentioned above is to be formed, and two transistors adjacent to each other are electrically isolated by the element isolation region interposed therebetween. The element isolation region STI has a depth of about 0.25 to 0.30 μm from the main surface of the semiconductor substrate 1, and is formed in the P-type well region PW, in the N-type well region NW, and at the boundary between the P-type well region PW and the N-type well region NW in a plan view. Since the element isolation region STI is shallower than the P-type well region PW and the N-type well region NW, a plurality of the active regions (not shown) surrounded by the element isolation region ST are formed in the P-type well region PW and the N-type well region NW. The P-type well region PW and the N-type well region NW each have an impurity profile in which impurity concentration increases from the main surface of the semiconductor substrate 1 toward the inside thereof, and the impurity concentration is the highest at the bottom of the element isolation region STI.

The low breakdown voltage N-type transistor LTN formed in a low breakdown voltage N-type transistor formation region LNR has a low breakdown voltage gate electrode LGN formed on the main surface of the semiconductor substrate 1 via a low breakdown voltage gate insulating film GIL and source/drain regions formed in the main surface of the semiconductor substrate 1 (in other words, P-type well region PW) on both sides of the low breakdown voltage gate electrode LGN. Each of the source/drain regions is comprised of an $N^-$ semiconductor region EXN (hereinafter referred to as a semiconductor region EXN) which is a low concentration semiconductor region and an $N^+$ semiconductor region NSD (hereinafter referred to as a semiconductor region NSD) which is a high concentration semiconductor region, and an impurity concentration of the semiconductor region EXN is lower than an impurity concentration of the semiconductor region NSD and a depth of the semiconductor region EXN is shallower than a depth of the semiconductor region NSD. The semiconductor region EXN is located between the semiconductor region NSD and the low breakdown voltage gate electrode LGN, and is partially overlapped with the low breakdown voltage gate electrode LGN. Namely, the semiconductor region EXN enters under the low breakdown voltage gate electrode LGN. The surface of the P-type well region PW between the source/drain regions serves as a channel formation region. Alternatively, the surface of the P-type well region PW between the semiconductor regions EXN of the source/drain regions may be referred to as the channel formation region.

Sidewall insulating films SW are formed on both sidewalls of the low breakdown voltage gate electrode LGN. An end portion of the semiconductor region EXN on a side closer to the channel formation region is overlapped with the low breakdown voltage gate electrode LGN and enters under the low breakdown voltage gate electrode LGN, but an end portion of the semiconductor region NSD on a side closer to the channel formation region is located outside the low breakdown voltage grate electrode LGN, and is not overlapped with the low breakdown voltage gate electrode LGN. The end portion of the semiconductor region EXN on a side closer to the channel formation region is separated from the end portion of the semiconductor region NSD on a side closer to the channel formation region by a distance almost equivalent to a thickness of the sidewall insulating film SW (thickness in a direction perpendicular to the sidewall of the low breakdown voltage gate electrode LGN). The end portion of the semiconductor region NSD on a side closer to the channel formation region is overlapped with the sidewall insulating film SW and enters under the sidewall insulating film SW.

In a plan view, silicide layers SL are formed on the source/drain regions so as to cover the semiconductor regions NSD in the regions exposed from the sidewall insulating films SW and the element isolation region STI. The silicide layer SL is formed also on an upper surface of the low breakdown voltage gate electrode LGN.

The low breakdown voltage N-type transistor LTN is covered with an interlayer insulating film IF, a plurality of openings formed in the interlayer insulating film IF are formed to expose each part of the silicide layers SL formed on the source/drain regions, and plug electrodes PG made of a metal film formed in the plurality of openings are in contact with the silicide layers SL formed on the source/drain regions. A plurality of wirings WL that are in contact with the plug electrodes PG are formed on the interlayer insulating film IF. Namely, the wirings WL are electrically connected to the source/drain regions through the plug electrodes PG.

The low breakdown voltage P-type transistor LTP formed in a low breakdown voltage P-type transistor formation region LPR has a low breakdown voltage gate electrode LGP formed on the main surface of the semiconductor substrate 1 via a low breakdown voltage gate insulating film GIL and source/drain regions formed in the main surface of the semiconductor substrate 1 (in other words, N-type well region NW) on both sides of the low breakdown voltage gate electrode LGP. Each of the source/drain regions is comprised of a $P^-$ semiconductor region EXP (hereinafter referred to as a semiconductor region EXP) which is a low concentration semi conductor region and a $P^+$ semiconductor region PSD (hereinafter referred to as a semiconductor region PSD) which is a high concentration semiconductor region, and an impurity concentration of the semiconductor region EXP is lower than an impurity concentration of the semiconductor region PSD and a depth of the semiconductor region EXP is shallower than a depth of the semiconductor region PSD. The semiconductor region EXP is located between the semiconductor region PSD and the low breakdown voltage gate electrode LGP, and is partially overlapped with the low breakdown voltage gate electrode LGP. Namely, the semiconductor region EXP enters under the low breakdown voltage gate electrode LGP. The surface of the N-type well region NW between the source/drain regions serves as a channel formation region. Alternatively, the surface of the N-type well region NW between the semiconductor regions EXP of the source/drain regions may be referred to as the channel formation region.

Sidewall insulating films SW are formed on both sidewalls of the low breakdown voltage gate electrode LGP. An end portion of the semiconductor region EXP on a side closer to the channel formation region is overlapped with the low breakdown voltage gate electrode LGP and enters under the low breakdown voltage gate electrode LGP, but an end portion of the semiconductor region PSD on a side closer to the channel formation region is not overlapped with the low breakdown voltage gate electrode LGP, The end portion of the semiconductor region EXP on a side closer to the channel formation region is separated from the end portion of the semiconductor region PSD on a side closer to the channel formation region by a distance almost equivalent to a thickness of the sidewall insulating film SW (thickness in a direction perpendicular to the sidewall of the low breakdown voltage gate electrode LGP). The end portion of the semiconductor region PSD on a side closer to the channel formation region is overlapped with the sidewall insulating film SW and enters under the sidewall insulating film SW.

In a plan view, silicide layers SL are formed on the source/drain regions so as to cover the semiconductor regions PSD in the regions exposed from the sidewall insulating films SW and the element isolation region STI.

The silicide layer SL is formed also on an upper surface of the low breakdown voltage gate electrode LGP.

The low breakdown voltage P-type transistor LTP is covered with the interlayer insulating film IF, a plurality of openings formed in the interlayer insulating film IF are formed to expose each part of the silicide layers SL formed on the source/drain regions, and plug electrodes PG made of a metal film formed in the plurality of openings are in contact with the silicide layers SL formed on the source/drain regions. A plurality of wirings WL that are in contact with the plug electrodes PG are formed on the interlayer insulating film IF. Namely, the wirings WL are electrically connected to the source/drain regions through the plug electrodes PG.

The high breakdown voltage N-type transistor HTN formed in a high breakdown voltage N-type transistor formation region HNR has a high breakdown voltage gate electrode HGN formed on the main surface of the semiconductor substrate 1 via a high breakdown voltage gate insulating film GIH and source/drain regions formed in the main surface of the semiconductor substrate 1 (in other words, P-type well region PW) on both sides of the high breakdown voltage gate electrode HGN. Each of the source/drain regions is comprised of an $N^-$ semiconductor region NLD (hereinafter referred to as a semiconductor region NLD) which is a low concentration semiconductor region and an $N^+$ semiconductor region NSD (hereinafter referred to as a semiconductor region NSD) which is a high concentration semiconductor region, and an impurity concentration of the semiconductor region NSD is higher than an impurity concentration of the semiconductor region NLD and the semiconductor region NSD is deeper than the semiconductor region NLD. The semiconductor region NLD is located between the semiconductor region NSD and the high breakdown voltage gate electrode HGN, and is partially overlapped with the high breakdown voltage gate electrode HGN. Namely, the semiconductor region NLD enters under the high breakdown voltage gate electrode HGN. The surface of the P-type well region PW between the source/drain regions serves as a channel formation region. Alternatively, the surface of the P-type well region PW between the semiconductor regions NLD of the source/drain regions may be referred to as the channel formation region.

The impurity concentration of the semiconductor region NLD is lower than that of the semiconductor region EXN. In addition, a gate length of the high breakdown voltage gate electrode HGN is longer than a gate length of the low breakdown voltage gate electrode LGN. In this case, the gate length means a length of the gate electrode in a direction connecting the source/drain regions.

Sidewall insulating films SW are formed on both sidewalls of the high breakdown voltage gate electrode HGN. An end portion of the semiconductor region LDN on a side closer to the channel formation region is overlapped with the high breakdown voltage gate electrode HGN and enters under the high breakdown voltage gate electrode HGN, but an end portion of the semiconductor region NSD on a side closer to the channel formation region is located outside the high breakdown voltage gate electrode HGN, and is not overlapped with the high breakdown voltage gate electrode HGN. The end portion of the semiconductor region NLD on a side closer to the channel formation region is separated from the end portion of the semiconductor region NSD on a side closer to the channel formation region by a distance almost equivalent to a thickness of the sidewall insulating film SW (thickness in a direction perpendicular to the sidewall of the high breakdown voltage gate electrode HGN). The end portion of the semiconductor region NSD on a side closer to the channel formation region is overlapped with the sidewall insulating film SW and enters under the sidewall insulating film SW.

In a plan view, silicide layers SL are formed on the source/drain regions so as to cover the semiconductor regions NSD in the regions exposed from the sidewall insulating films SW and the element isolation region STI. The silicide layer SL is formed also on an upper surface of the high breakdown voltage gate electrode HGN.

The high breakdown voltage N-type transistor HTN is covered with the interlayer insulating film IF, a plurality of openings formed in the interlayer insulating film IF are formed to expose each part of the silicide layers SL formed on the source/drain regions, and plug electrodes PG made of a metal film formed in the plurality of openings are in contact with the silicide layers SL formed on the source/drain regions. A plurality of wirings WL that are in contact with the plug electrodes PG are formed on the interlayer insulating film IF. Namely, the wirings WL are electrically connected to the source/drain regions through the plug electrodes PG.

The high breakdown voltage P-type transistor HTP formed in a high breakdown voltage P-type transistor formation region HPR has a high breakdown voltage gate electrode HGP formed on the main surface of the semiconductor substrate 1 via a high breakdown voltage gate insulating film GIH and source/drain regions formed in the main surface of the semiconductor substrate 1 (in other words, N-type well region NW) on both sides of the high breakdown voltage gate electrode HGP, Each of the source/drain regions is comprised of a $P^-$ semiconductor region PLD (hereinafter referred to as a semiconductor region PLD) which is a low concentration semiconductor region and a $P^+$ semiconductor region PSD (hereinafter referred to as a semiconductor region PSD) which is a high concentration semiconductor region, and an impurity concentration of the semiconductor region PSD is higher than an impurity concentration of the semiconductor region PLD and the semiconductor region PSD is deeper than the semiconductor region PLD. The semiconductor region PLD is located between the semiconductor region PSD and the high breakdown voltage gate electrode HGP, and is partially overlapped with the high breakdown voltage gate electrode HGP. Namely, the semiconductor region PLD enters under the high breakdown voltage gate electrode HGP. The surface of the N-type well region NW between the source/drain regions serves as a channel formation region. Alternatively, the surface of the N-type well region NW between the semiconductor regions PLD of the source/drain regions may be referred to as the channel formation region.

The impurity concentration of the semiconductor region PLD is lower than that of the semiconductor region EXP. In addition, a gate length of the high breakdown voltage gate electrode HGP is longer than a gate length of the low breakdown voltage gate electrode LGP.

Sidewall insulating films SW are formed on both sidewalls of the high breakdown voltage gate electrode HGP, An end portion of the semiconductor region PLD on a side closer to the channel formation region is overlapped with the high breakdown voltage gate electrode HGP and enters under the high breakdown voltage gate electrode HGP, but an end portion of the semiconductor region PSD on a side closer to the channel formation region is located outside the high breakdown voltage gate electrode HGP, and is not overlapped with the high breakdown voltage gate electrode HGP. The end portion of the semiconductor region PLD on a side closer to the channel formation region is separated from, the end portion of the semiconductor region PSD on a side closer to the channel formation region by a distance almost equivalent to a thickness of the sidewall insulating film. SW (thickness in a direction perpendicular to the sidewall of the high breakdown voltage gate electrode HGP). The semiconductor region PSD is overlapped with the sidewall insulating film SW and enters under the sidewall insulating film SW.

In a plan view, silicide layers SL are formed on the source/drain regions so as to cover the semiconductor regions PSD in the regions exposed, from the sidewall insulating films SW and the element isolation, region STI. The silicide layer SL is formed also on an upper surface of the high breakdown voltage gate electrode HGP.

The high breakdown voltage P-type transistor HTP is covered with the interlayer insulating film IF, a plurality of openings formed in the interlayer insulating film IF are formed to expose each part of the silicide layers SL formed on the source/drain regions, and plug electrodes PG made of a metal film formed in the plurality of openings are in contact with the silicide layers SL formed on the source/drain regions. A plurality of wirings WL that are in contact with the plug electrodes PG are formed on the interlayer insulating film IF. Namely, the wirings WL are electrically connected to the source/drain regions through the plug electrodes PG.

The polysilicon resistor PR formed in a resistance element formation region RR is formed on the main, surface of the semiconductor substrate 1 via the element isolation region (element isolation film) STI, and has a resistance portion RSP and two terminal portions TMP arranged at both ends of the resistance portion RSP. The resistance portion RSP is a P-type impurity layer PIL containing a P-type impurity, and each of the terminal portions TMP is similarly a P-type impurity layer PIL2 containing a P-type impurity. An impurity concentration of the terminal portion TMP is higher than an impurity concentration of the resistance portion. RSP, and a thickness of the resistance portion RSP is smaller than a thickness of the terminal portion TMP. A silicide layer SL is formed on each upper surface of the terminal portions TMP exposed from, an insulating film SB that covers the resistance portion RSP and sidewall insulating films SW formed on sidewalls of the terminal portions TMP.

The polysilicon resistor PR is covered with the interlayer insulating film IF, a plurality of openings formed in the interlayer insulating film IF are formed to expose each part of the silicide layers SL formed on the two terminal portions TMP, and plug electrodes PG made of a metal film formed in the plurality of openings are in contact with the silicide layers SL formed on the two terminal portions TMP. A plurality of wirings WL that are in contact with the plug electrodes PG are formed on the interlayer insulating film IF. Namely, the wirings WL are electrically connected to the two terminal portions TMP through the plug electrodes PG.

<Manufacturing Method of Semiconductor Device>

The semiconductor device according to the present embodiment is configured as described above, and a manufacturing method thereof will be described below with reference to drawings.

FIG. 1 is a process flow diagram showing a part of a manufacturing process of the semiconductor device of the present embodiment. FIG. 2 to FIG. 12 are cross-sectional views each showing a principal part of the semiconductor device in the manufacturing process of the present embodiment. FIG. 2 to FIG. 12 each show the resistance element formation region RR (hereinafter referred to as an R region), the low breakdown voltage N-type transistor formation region. LNR (hereinafter referred to as an LN region), the low breakdown voltage P-type transistor formation region LPR (hereinafter referred to as an LP region), the high breakdown voltage N-type transistor formation region HNR (hereinafter referred to as an HN region), and the high breakdown voltage P-type transistor formation region HPR (hereinafter referred to as an HP region) provided for the main surface of the semiconductor substrate 1 similarly to FIG. 13.

First, a process of "preparation of semiconductor substrate 1" (step S1) shown in FIG. 1 is performed.

Figure 2:
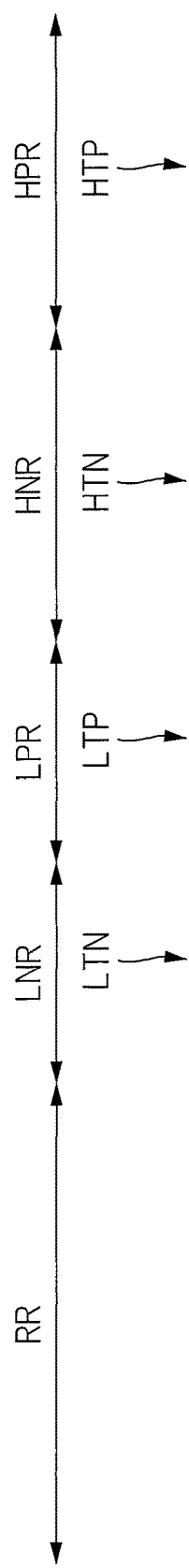
FIG. 2 is a cross-sectional view showing a principal part of the semiconductor device in the manufacturing process according to the first embodiment.
Figure 2:
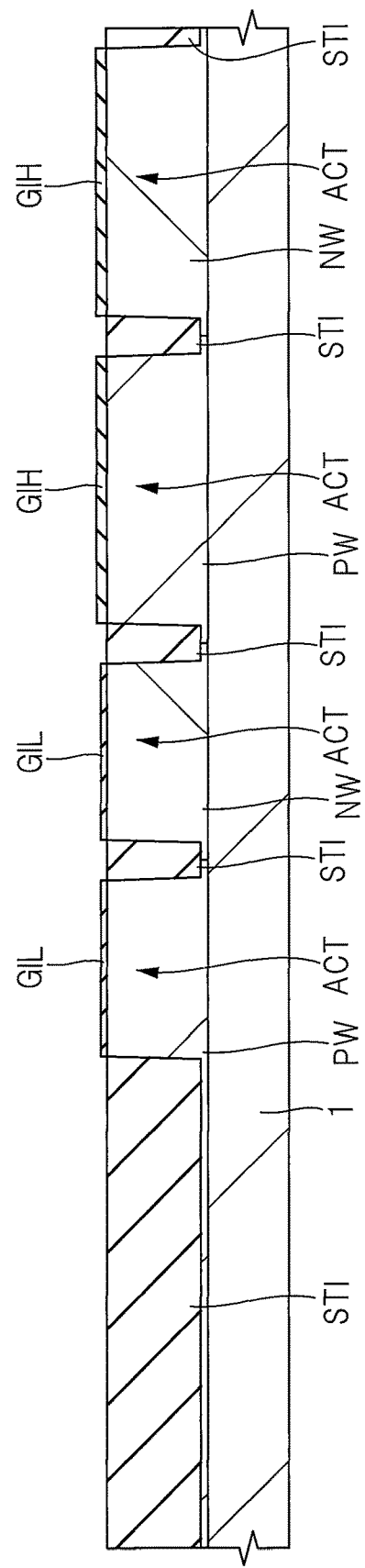

As shown in FIG. 2, each of the LN region LNR, the LP region LPR, the HN region HNR and the HP region HPR is comprised of an active region ACT and the element isolation region STI surrounding the active region ACT. The active regions ACT and the element isolation region STI are arranged in such a manner that the active regions ACT serving as "islands" are surrounded by the element isolation region STI serving as "sea". Namely, the active regions ACT adjacent to each other are electrically isolated by the element isolation region STI. The element isolation region STI is formed by embedding an insulating film such as a silicon oxide film in a trench formed in the main surface of the semiconductor substrate 1, and the element isolation region STI has a depth of about 0.25 to 0.30 μm from the main surface of the semiconductor substrate 1.

The active regions ACT of the LN region LNR and the HN region HNR each have the P-type well region PW, and the active regions ACT of the LP region LPR and the HP region HPR each have the N-type well region NW. In the R region RR, the element isolation region STI is formed on the surface of the P-type well region PW. The P-type well region PW and the N-type well region NW are deeper than the element isolation region STI, and the boundary between the P-type well region PW and the N-type well region NW is located below the element isolation region STI. Further, the P-type well region PW is formed by ion-implanting an impurity such as boron (B) into the main surface of the semiconductor substrate 1. The N-type well region NW is formed by ion-implanting an impurity such as phosphorus (P) into the main surface of the semiconductor substrate 1. Note that the P-type well regions PW of the LN region LNR and the HN region HNR may be formed in different processes, at different impurity concentrations, and with different implantation energies. Similarly, the N-type well regions NW of the LP region LPR and the HP region HPR may also be formed in different processes, at different impurity concentrations, and with different implantation energies.

Then, on the main surface of the semiconductor substrate 1, the high breakdown voltage gate insulating film (gate insulating film) GIH is formed in the HN region HNR and the HP region HPR, and the low breakdown voltage gate insulating film (gate insulating film) GIL is formed in the LN region LNR and the LP region LPR. The high breakdown voltage gate insulating film GIH and the low breakdown voltage gate insulating film GIL are comprised of a silicon oxide film, a silicon oxynitride film, a silicon nitride film, a High-k insulating film, or a stacked film, of these films. For example, the high breakdown, voltage gate insulating film GIH has a thickness larger than that of the low breakdown voltage gate insulating film GIL. Here, when the kinds of two films are different, these films are compared based on the equivalent silicon oxide thickness (EOT). For example, the high breakdown voltage gate insulating film GIH is comprised of a silicon oxynitride film with a thickness of about 15 nm and the low breakdown voltage gate insulating film GIL is comprised of a silicon oxynitride film with a thickness of about 1 nm, respectively.

Next, a process of "formation of gate electrode and polysilicon resistor PR" (step S2) shown in FIG. 1 is performed.

Figure 3:
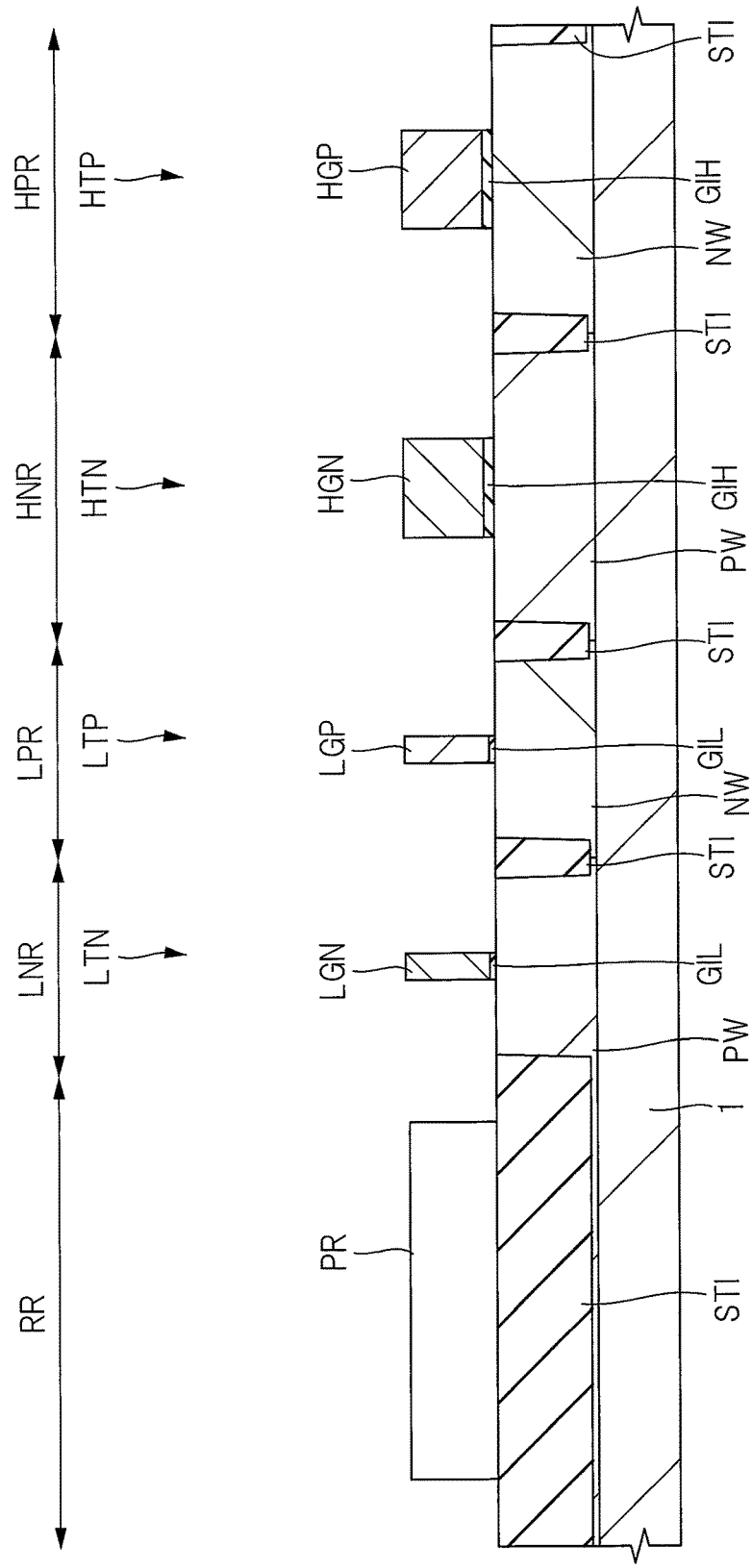
FIG. 3 is a cross-sectional view showing a principal part of the semiconductor device in the manufacturing process continued from FIG. 2.

As shown in FIG. 3, the non-doped polysilicon resistor PR is formed in the R region RR, the n-type low breakdown voltage gate electrode LGN is formed in the LN region LNR, the p-type low breakdown voltage gate electrode LGP is formed in the LP region LPR, the n-type high breakdown voltage gate electrode HGN is formed in the HN region HPR, and the p-type high breakdown voltage gate electrode HGP is formed in the HP region HPR.

After depositing a silicon film (polysilicon film, polycrystalline silicon film) with a thickness of about 150 nm over the high breakdown voltage gate insulating film GIH and the low breakdown voltage gate insulating film GIL, the silicon film in the LN region LNR and the HN region HNR is turned into an n-type silicon film by introducing an n-type impurity (for example, phosphorus) thereto. Also, the silicon film in the LP region LPR and the HP region HPR is turned into a p-type silicon film by introducing a p-type impurity (for example, boron) thereto. In this case, neither a p-type impurity nor an n-type impurity is introduced to the polysilicon resistor PR to form a non-doped silicon film.

Next, the silicon film is patterned by using the photolithography method and the etching method to form the n-type low breakdown voltage gate electrode LGN, the p-type low breakdown voltage gate electrode LGP, the n-type high breakdown voltage gate electrode HGN, the p-type high breakdown voltage gate electrode HGP, and the non-doped polysilicon resistor PR. At this time, the low breakdown voltage gate insulation film GIL below the silicon film is also patterned to have the same planar shape as that of the gate electrode thereon. Also, an upper surface of the high breakdown voltage gate insulating film GIH below the silicon film, which is close to the gate electrode, is partially patterned.

Namely, a stacked structure of the patterned low breakdown voltage gate insulating film GIL and low breakdown voltage gate electrode LGN is formed on the main surface of the semiconductor substrate 1 in the LN region LNR, and a stacked structure of the patterned low breakdown voltage gate insulating film GIL and low breakdown voltage gate electrode LGP is formed on the main surface of the semiconductor substrate 1 in the LP region LPR. Also, a stacked structure of the high breakdown voltage gate electrode HGN and the partially patterned high breakdown voltage gate insulating film GIH is formed on the main surface of the semiconductor substrate 1 in the HN region HNR, and a stacked structure of the high breakdown voltage gate electrode HGP and the partially patterned high breakdown voltage gate insulating film GIH is formed on the main surface of the semiconductor substrate 1 in the HP region HPR. Further, the polysilicon resistor PR is formed on the element isolation region STI in the R region RR.

Next, a process of "formation of N⁻ semiconductor region NLD" (step S3) shown in FIG. 1 is performed.

Figure 4:
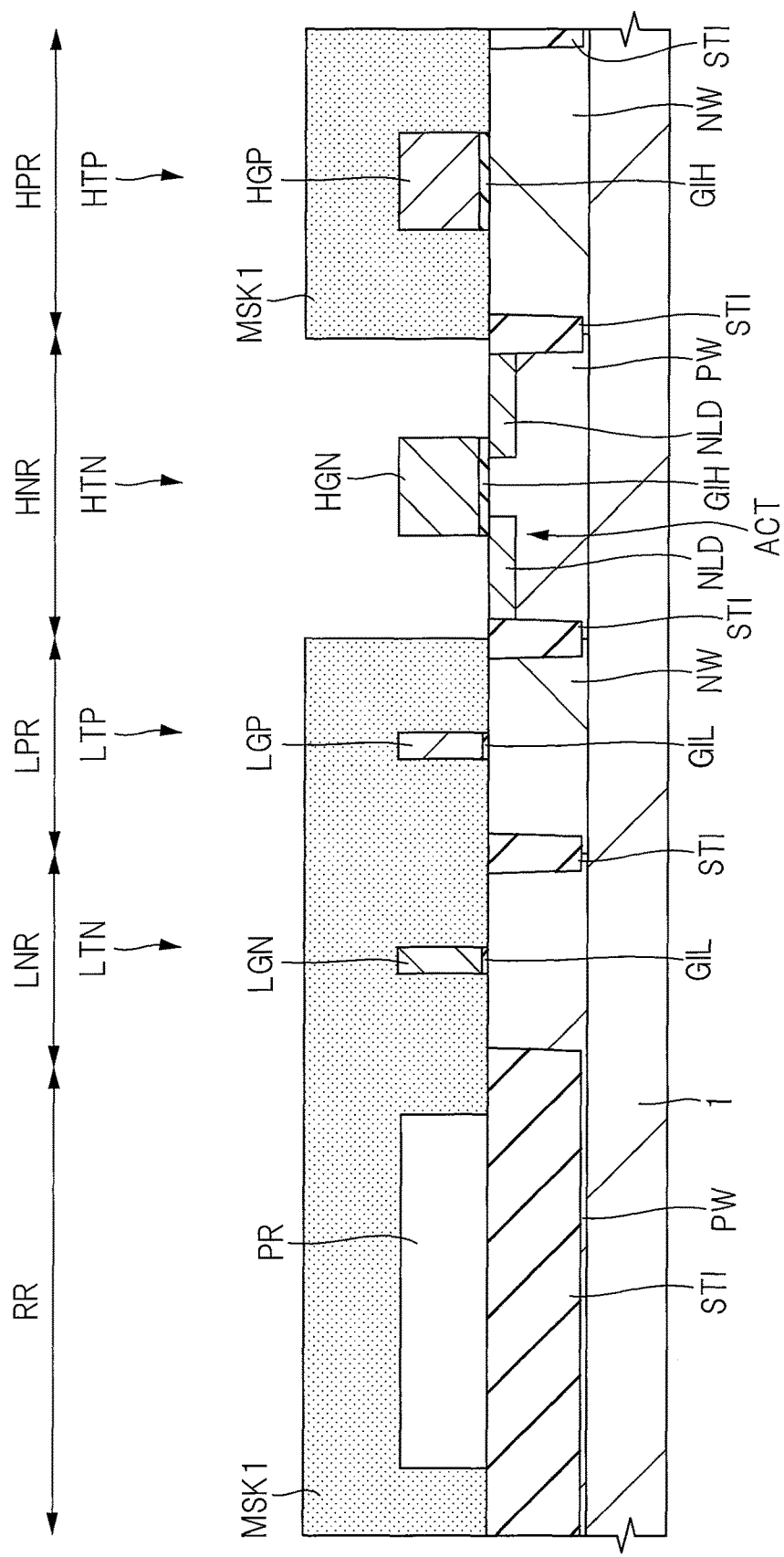
FIG. 4 is a cross-sectional view showing a principal part of the semiconductor device in the manufacturing process continued from FIG. 3.

As shown in FIG. 4, in the HN region HNR, the semiconductor regions NLD are formed in the P-type well region PW at both ends of the high breakdown voltage gate electrode HGN. First, a mask film MSK1 that covers the R region RR, the LN region LNR, the LP region LPR and the HP region HPR and exposes the HN region HNR is formed over the main surface of the semiconductor substrate 1. The mask film MSK1 is comprised of, for example, an insulating film such as a photoresist layer (the same is true of the following mask films).

Then, an N-type impurity such as phosphorus (P) is ion-implanted into the main surface of the semiconductor substrate 1 in the HN region HNR at a dose amount of $5.0E13/cm^2$ with using the mask film MSK1 to form the semiconductor regions NLD. The semiconductor regions NLD are formed in self-alignment with the high breakdown voltage gate electrode HGN. Namely, the semiconductor regions NLD are formed in the regions sandwiched between the high breakdown voltage gate electrode HGN and the element isolation regions STI at both ends of the high breakdown voltage gate electrode HGN.

Next, a process of "formation of P⁻ semiconductor region PLD" (step S4) shown in FIG. 1 is performed.

Figure 5:
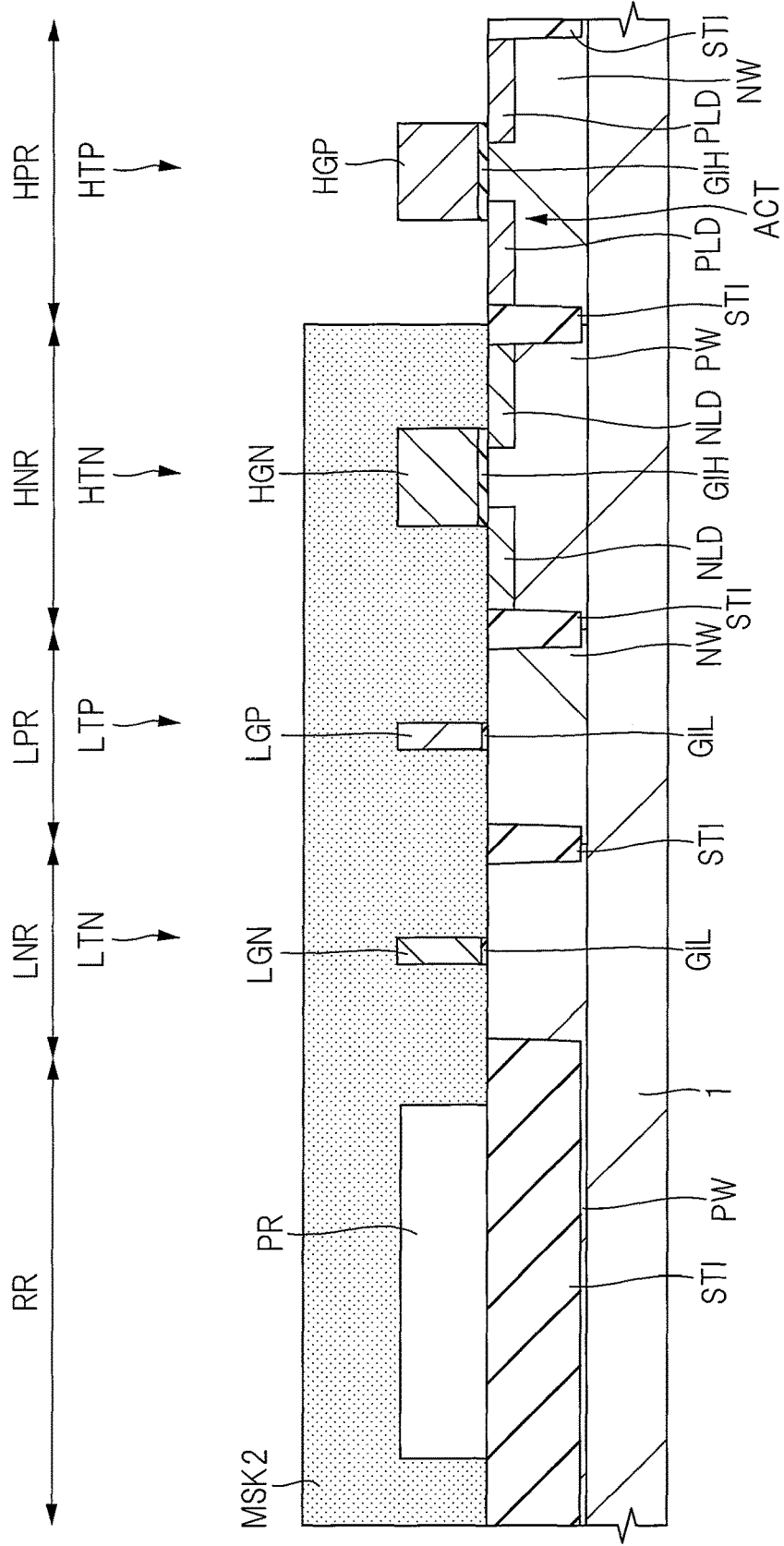
FIG. 5 is a cross-sectional view showing a principal part of the semiconductor device in the manufacturing process continued from FIG. 4.

As shown in FIG. 5, in the HP region HPR, the semiconductor regions PLD are formed in the N-type well region NW at both ends of the high breakdown voltage gate electrode HGP. First, a mask film MSK2 that covers the R region RR, the LN region LNR, the LP region LPR and the HN region HNR and exposes the HP region HPR is formed over the main surface of the semiconductor substrate 1.

Then, a P-type impurity such as boron (B) is ion-implanted into the main surface of the semiconductor substrate 1 in the HP region HPR at a dose amount of $4.0E13/cm^2$ with using the mask film MSK2 to form the semiconductor regions PLD. The semiconductor regions PLD are formed in self-alignment with the high breakdown voltage gate electrode HGP. Namely, the semiconductor regions PLD are formed in the regions sandwiched between the high breakdown voltage gate electrode HGP and the element isolation regions STI at both ends of the high breakdown voltage gate electrode HGP.

Next, a process of "formation of N⁻ semiconductor region EXN" (step S5) shown in FIG. 1 is performed.

Figure 6:
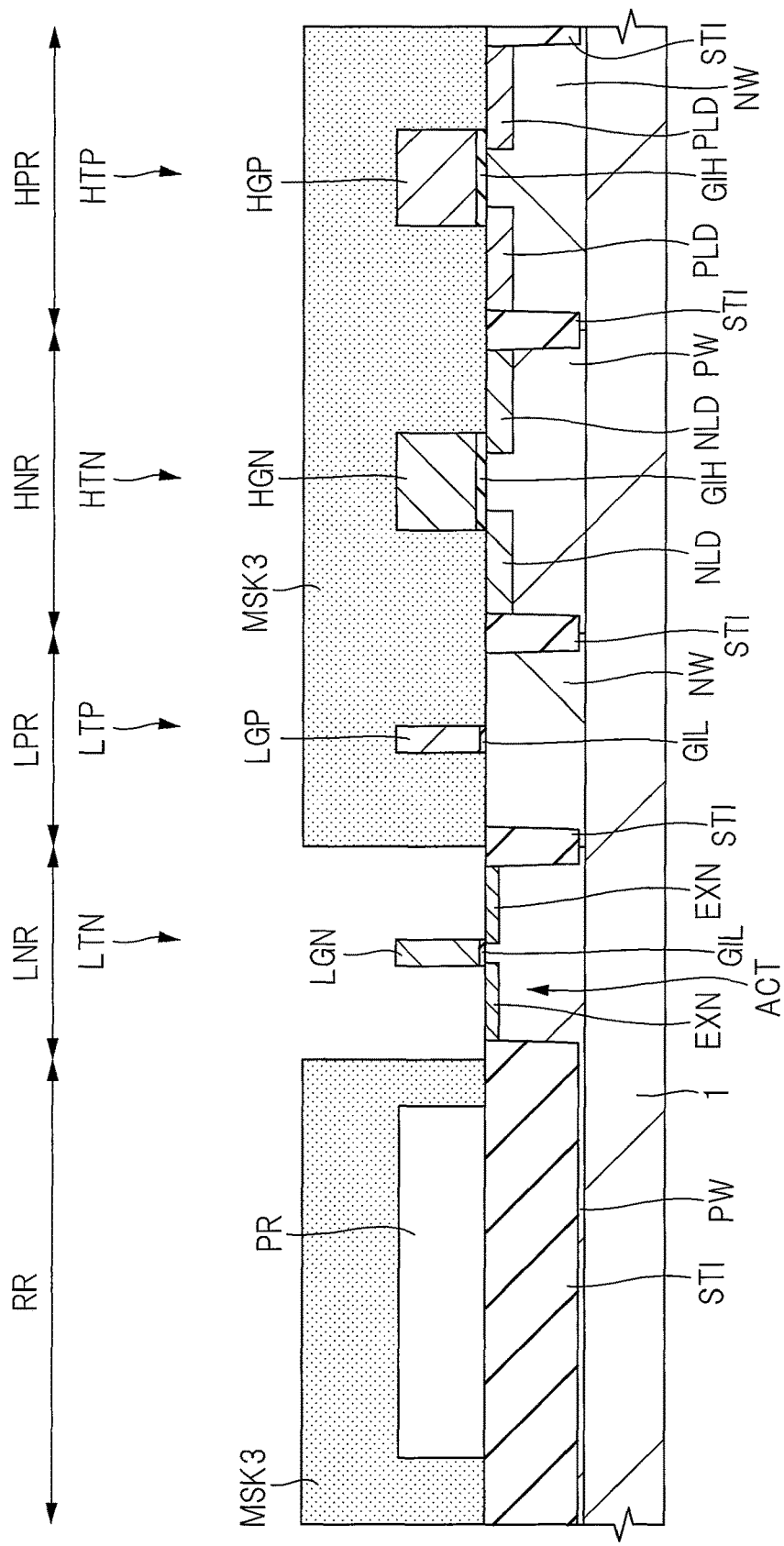
FIG. 6 is a cross-sectional view showing a principal part of the semiconductor device in the manufacturing process continued from FIG. 5.

As shown in FIG. 6, in the LN region LNR, the semiconductor regions EXN are formed in the P-type well region PW at both ends of the low breakdown voltage gate electrode LGN. First, a mask film MSK3 that covers the R region RR, the LP region LPR, the HN region HNR and the HP region HPR and exposes the LN region LNR is formed over the main surface of the semiconductor substrate 1.

Then, an N-type impurity such as arsenic (As) is ion-implanted into the main surface of the semiconductor substrate 1 in the LN region LNR at a dose amount of $3.0E14/cm^2$ with using the mask film MSK3 to form the semiconductor regions EXN. The semiconductor regions EXN are formed in self-alignment with the low breakdown voltage gate electrode LGN. Namely, the semiconductor regions EXN are formed in the regions sandwiched between the low breakdown voltage gate electrode LGN and the element isolation regions STI at both ends of the low breakdown voltage gate electrode LGN.

Next, a process of "formation of P⁻ semiconductor region EXP" (step S6) shown in FIG. 1 is performed.

Figure 7:
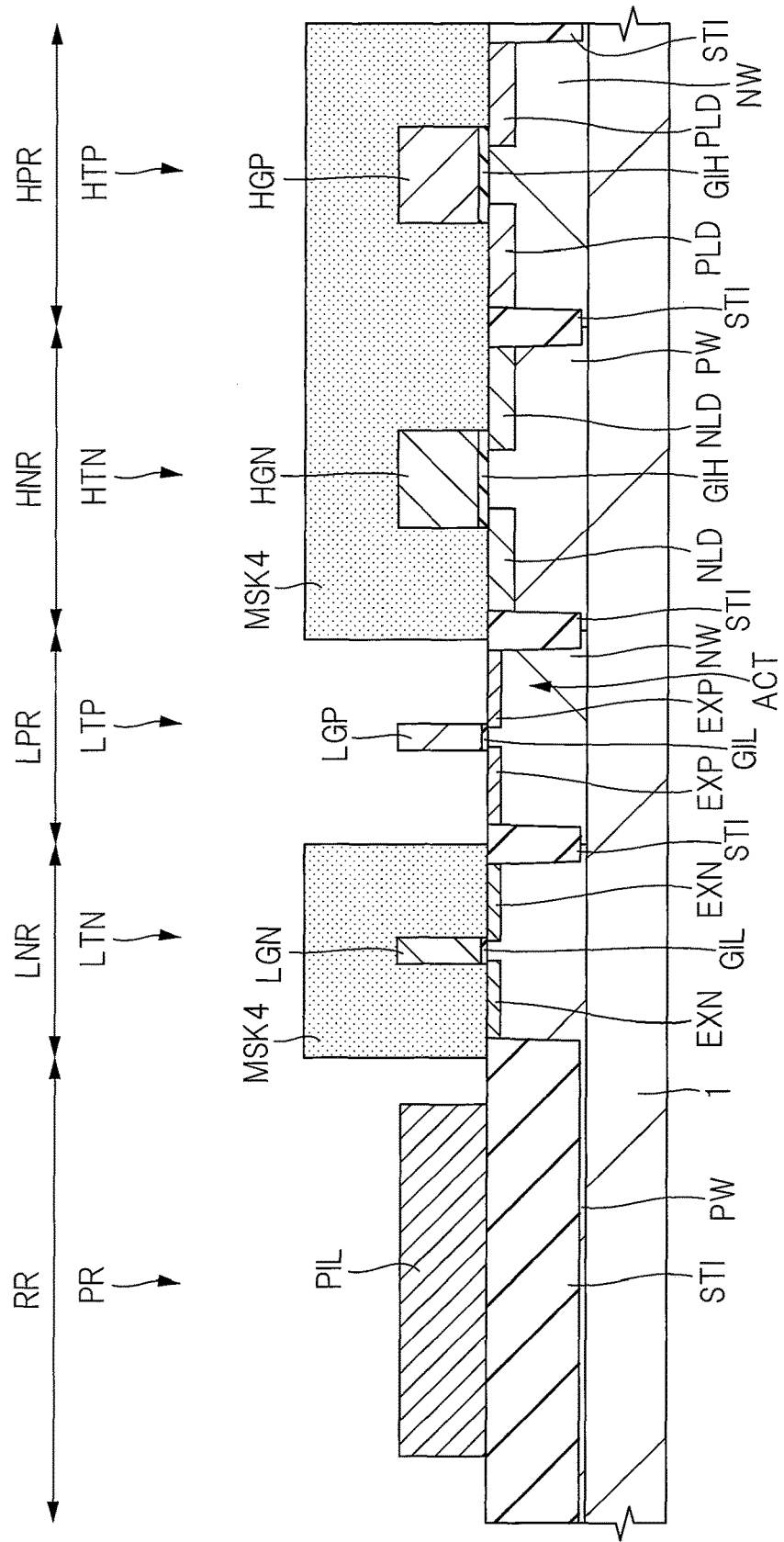
FIG. 7 is a cross-sectional view showing a principal part of the semiconductor device in the manufacturing process continued from FIG. 6.

As shown in FIG. 7, in the LP region LPR, the semiconductor regions EXP are formed in the N-type well region NW at both ends of the low breakdown voltage gate electrode LGP. At the same time, the P-type impurity layer PIL is formed in the polysilicon resistor PR in the R region RR. First, a mask film MSK4 that covers the LN region LNR, the HN region HNR and the HP region HPR and exposes the R region RR and the LP region LPR is formed over the main surface of the semiconductor substrate 1.

Then, a P-type impurity such as boron fluoride (BF2) is ion-implanted into the main surface of the semiconductor substrate 1 in the LP region LPR and the polysilicon resistor PR in the R region RR at a dose amount of $3.0E14/cm^2$ with using the mask film MSK4 to form the semiconductor regions EXP and the P-type impurity layer PIL. The semiconductor regions EXP are formed in self-alignment with the low breakdown voltage gate electrode LGP. Namely, the semiconductor regions EXP are formed in the regions sandwiched between the low breakdown voltage gate electrode LGP and the element isolation regions STI at both ends of the low breakdown voltage gate electrode LGP. The P-type impurity layer PIL is formed over the entire region of the polysilicon resistor PR.

Here, it is important that the dose amount of the P-type impurity ($3.0E14/cm^2$) introduced to the polysilicon resistor PR is larger than the dose amount of the P-type impurity ($4.0E13/cm^2$) for forming the semiconductor regions PLD of the high breakdown voltage P-type transistor HTP.

Next, a process of "formation of resistance portion RSP" (step S7) shown in FIG. 1 is performed.

Figure 8:
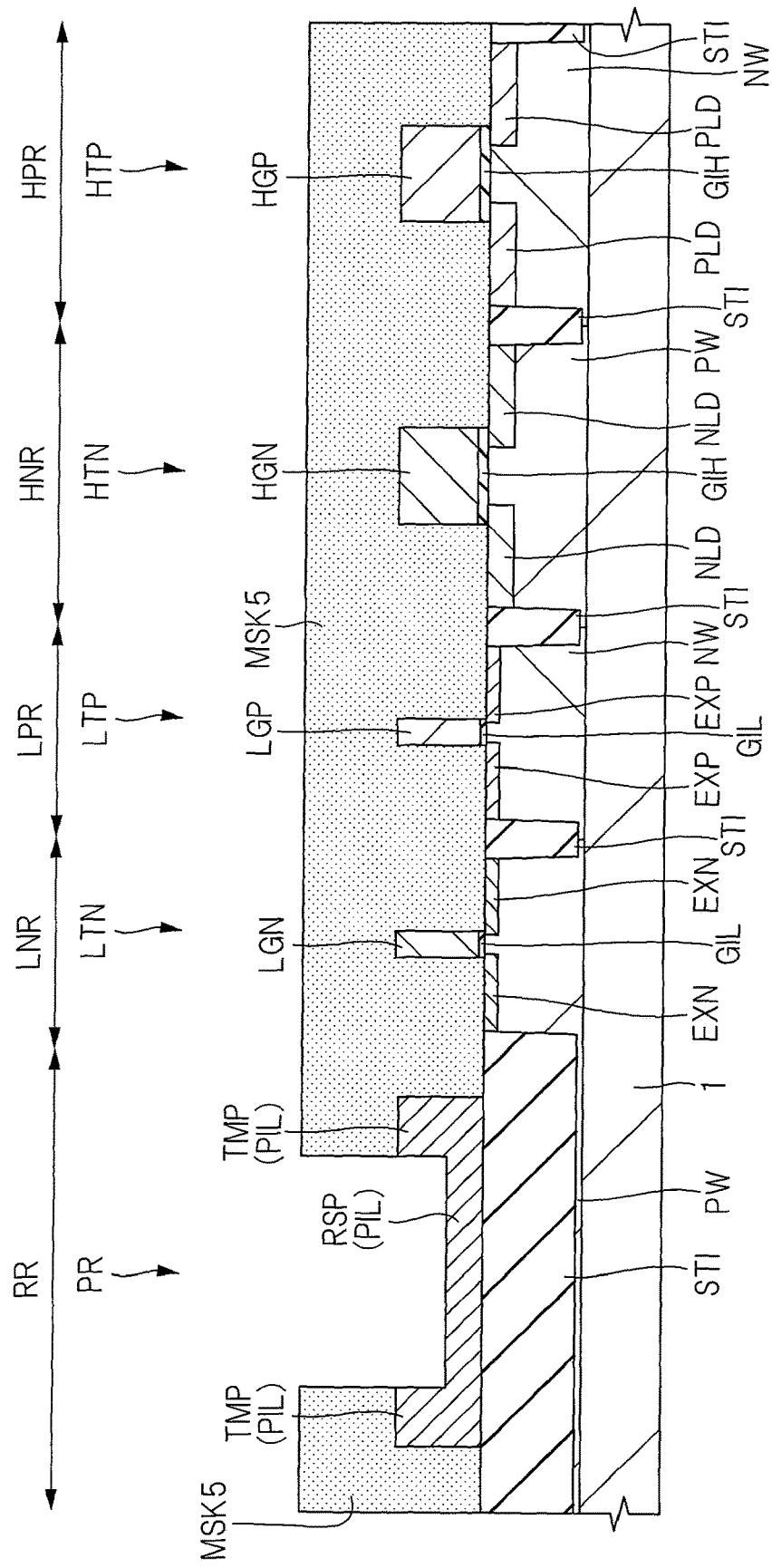
FIG. 8 is a cross-sectional view showing a principal part of the semiconductor device in the manufacturing process continued from FIG. 7.

As shown in FIG. 8, the resistance portion RSP of the polysilicon resistor PR is selectively thinned in the R region RR. First, a mask film MSK5 that covers the terminal portions TMP in the R region RR, the LN region LNR, the LP region LPR, the HN region HNR and the HP region HPR and exposes the resistance portion RSP in the R region RR is formed over the main surface of the semiconductor substrate 1.

By the dry etching or the wet etching using the mask film MSK5, the thickness of the resistance portion RSP of the polysilicon resistor PR is made smaller than the thickness of each of the terminal portions TMP in the R region RR, the low breakdown voltage gate electrodes LGN and LGP, and the high breakdown voltage gate electrodes HGN and HGP. The thickness of the resistance portion RSP is set to about one-tenth to one-fifth of the thickness of the terminal portion TMP, that is, about 15 to 30 nm.

The case in which only the resistance portion RSP is selectively thinned has been described here, but the resistance portion RSP and the terminal portions TMP may be thinned in the same manner.

Next, a process of "formation of sidewall insulating film SW" (step S8) shown in FIG. 1 is performed.

Figure 9:
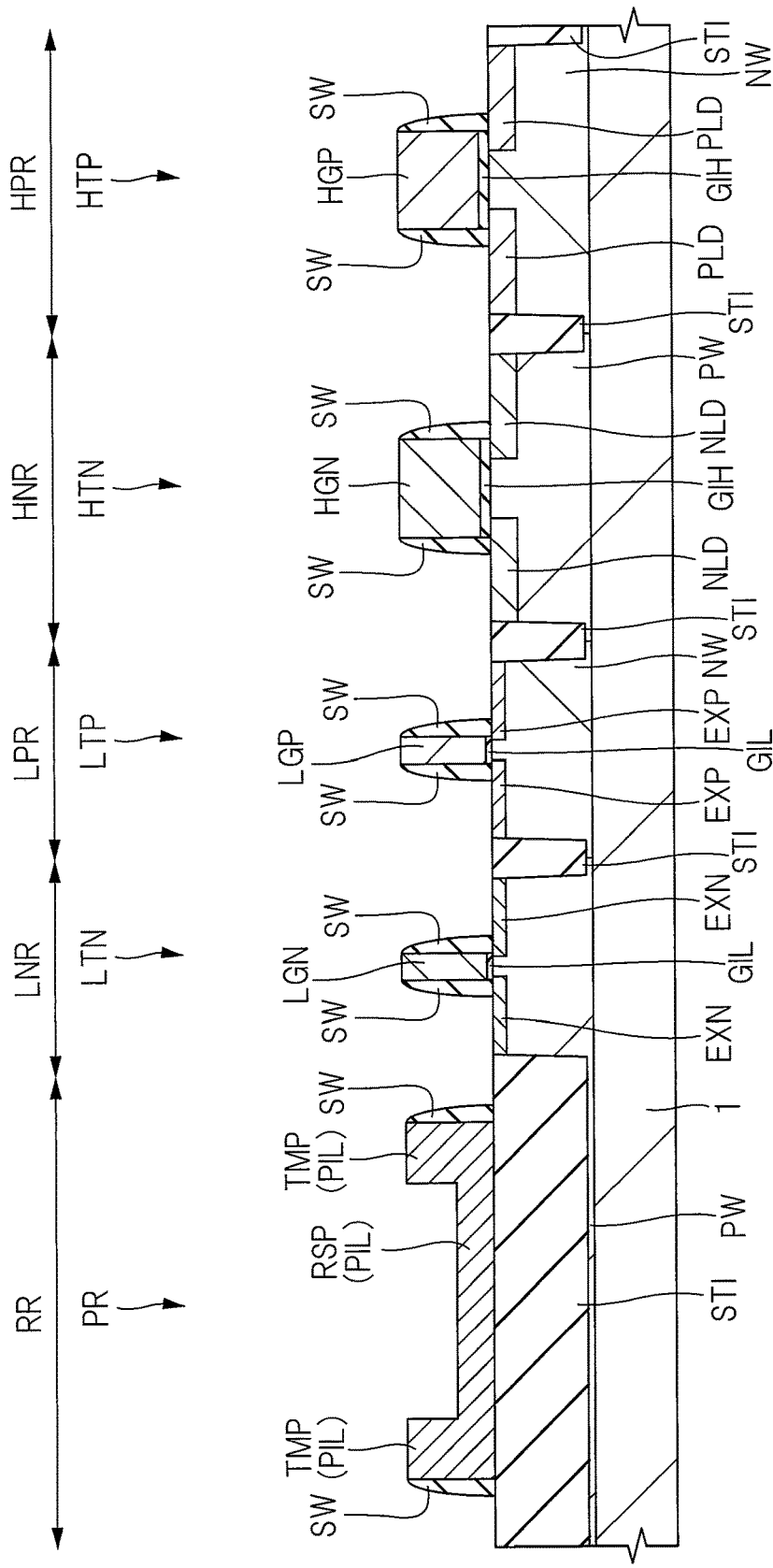
FIG. 9 is a cross-sectional view showing a principal part of the semiconductor device in the manufacturing process continued from FIG. 8.

As shown in FIG. 9, the sidewall insulating films SW are formed on the sidewalls of the low breakdown voltage gate electrodes LGN and LGP, the sidewalls of the high breakdown voltage gate electrodes HGN and HGP and the sidewalls of the terminal portions TMP of the polysilicon resistor PR. The sidewall insulating film SW is comprised of, for example, a silicon oxide film or a stacked film of a silicon oxide film and a silicon nitride film.

For example, by depositing a silicon oxide film over the main surface of the semiconductor substrate 1 and subjecting the silicon oxide film to anisotropic dry etching, the sidewall insulating films SW made of the silicon oxide film are formed on the sidewalls of the low breakdown voltage gate electrodes LGN and LGP, the sidewalls of the high breakdown voltage gate electrodes HGN and HGP and the sidewalls of the terminal portions TMP of the polysilicon resistor PR.

Next, a process of "formation of $N^+$ semiconductor region NSD" (step S9) shown in FIG. 1 is performed.

Figure 10:
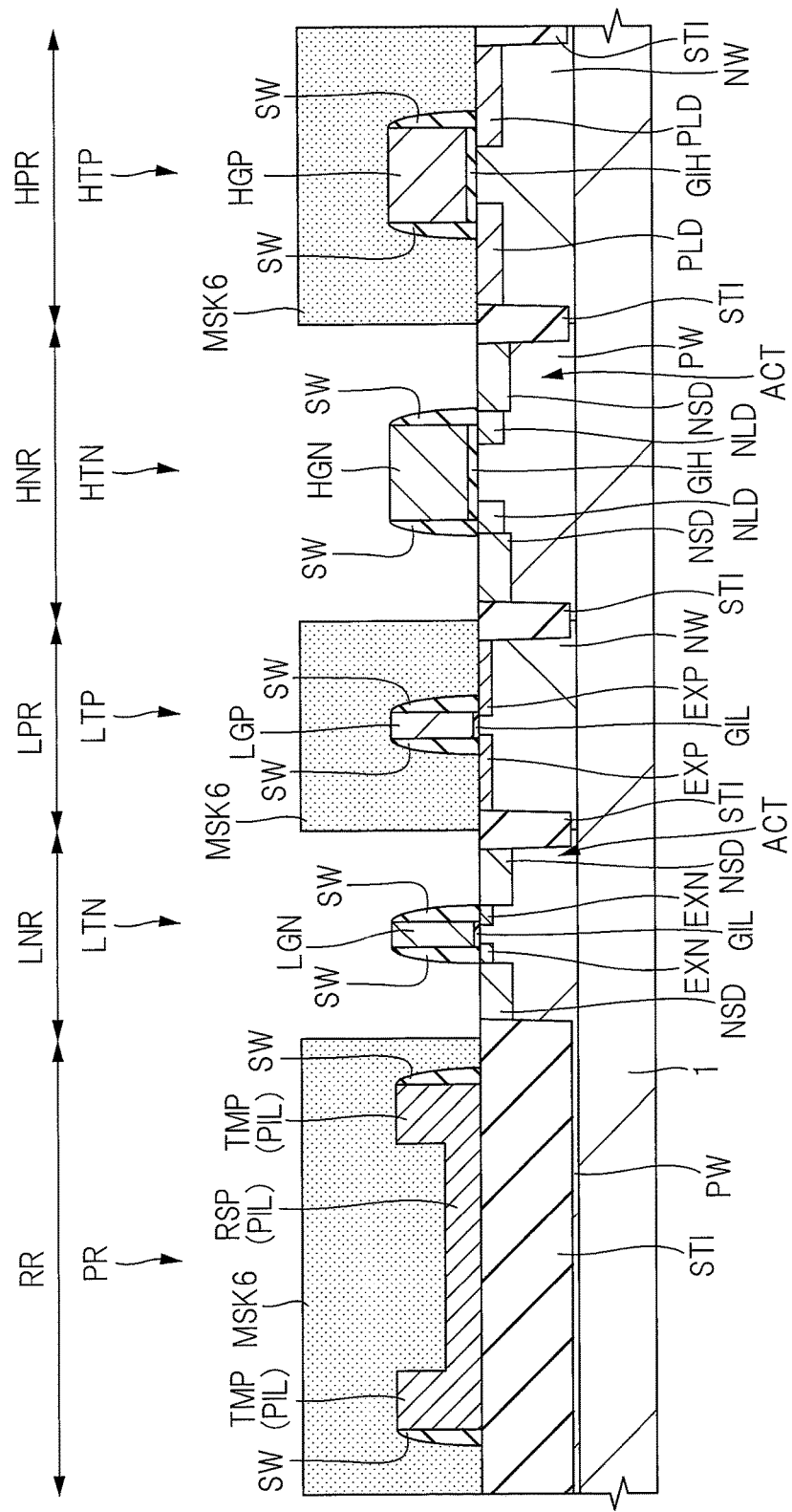
FIG. 10 is a cross-sectional view showing a principal part of the semiconductor device in the manufacturing process continued from FIG. 9.

As shown in FIG. 10, the semiconductor regions NSD are formed in the P-type well region PW at both ends of the low breakdown voltage gate electrode LGN and the sidewall insulating films SW in the LN region LNR. At the same time, the semiconductor regions NSD are formed in the P-type well region PW at both ends of the high breakdown voltage gate electrode HGN and the sidewall insulating films SW in the HN region HNR. First, a mask film MSK6 that covers the R region RR, the LP region LPR and the HP region HPR and exposes the LN region LNR and the HN region HNR is formed over the main surface of the semiconductor substrate 1.

Then, an N-type impurity such as arsenic (As) is ion-implanted into the main surface of the semiconductor substrate 1 in the LN region LNR and the HN region HNR at a dose amount of $4.0E15/cm^2$ with using the mask film MSK6 to form the semiconductor regions NSD. In the LN region LNR, the semiconductor regions NSD are formed in self-alignment with the low breakdown voltage gate electrode LGN and the sidewall insulating films SW. Namely, the semiconductor regions NSD are formed in the regions sandwiched between the sidewall insulating films SW and the element isolation regions STI at both ends of the low breakdown voltage gate electrode LGN and the sidewall insulating films SW. Thus, each of the source/drain regions of the low breakdown voltage N-type transistor LTN includes the semiconductor region EXN and the semiconductor region NSD. Also, in the HN region HNR, the semiconductor regions NSD are formed in self-alignment with the high breakdown voltage gate electrode HGN and the sidewall insulating films SW. Namely, the semiconductor regions NSD are formed in the regions sandwiched between the sidewall insulating films SW and the element isolation regions STI at both ends of the high breakdown voltage gate electrode HGN and the sidewall insulating films SW. Thus, each of the source/drain regions of the high breakdown voltage N-type transistor HTN includes the semiconductor region NLD and the semiconductor region NSD.

Next, a process of "formation of $P^+$ semiconductor region PSD" (step S10) shown in FIG. 1 is performed.

Figure 11:
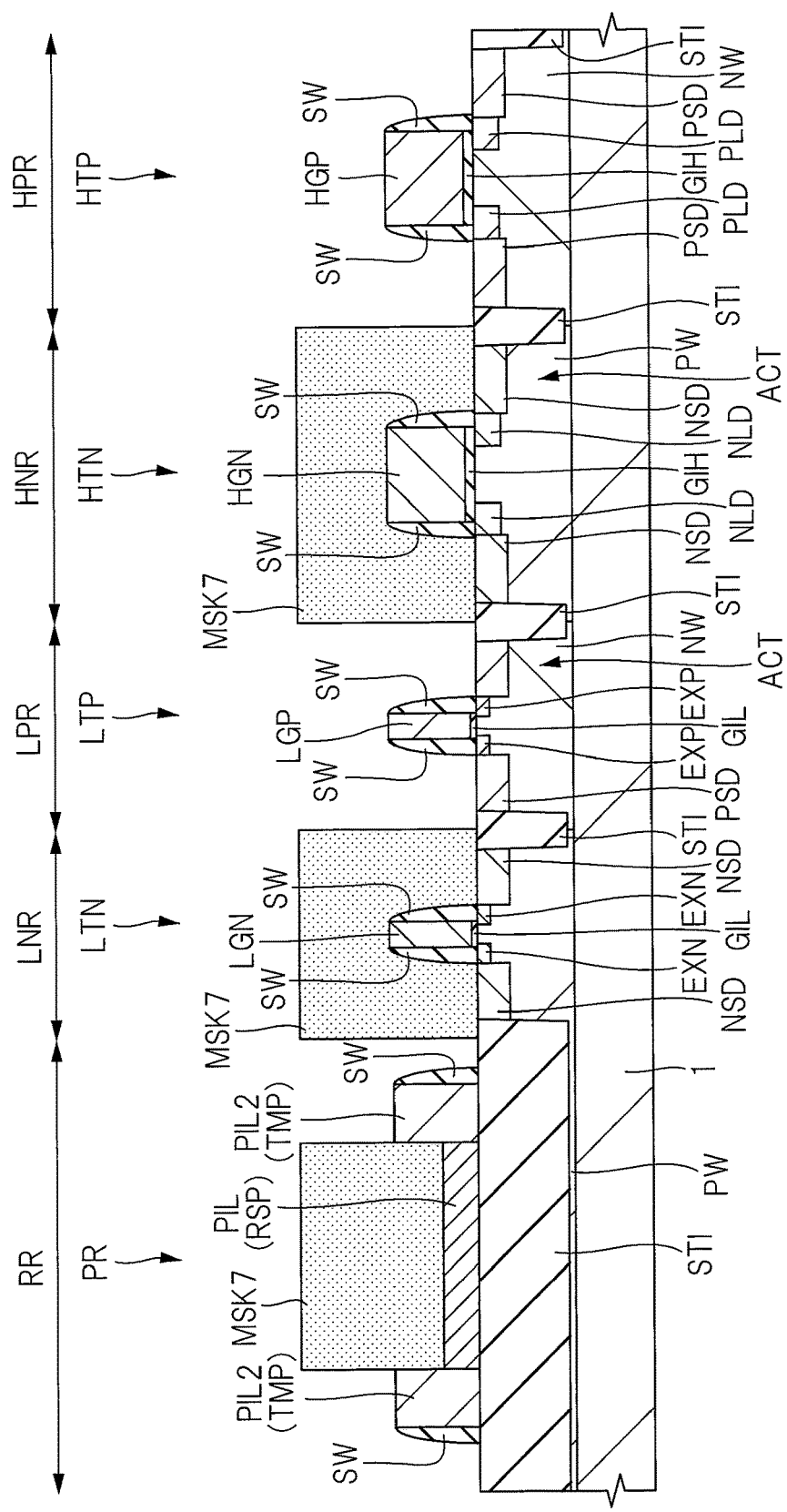
FIG. 11 is a cross-sectional view showing a principal part of the semiconductor device in the manufacturing process continued from FIG. 10.

As shown in FIG. 11, the semiconductor regions PSD are formed in the N-type well region NW at both ends of the low breakdown voltage gate electrode LGP and the sidewall insulating films SW in the LP region LPR. At the same time, the semiconductor regions PSD are formed in the N-type well region NW at both ends of the high breakdown voltage gate electrode HGP and the sidewall insulating films SW in the HP region HPR. Further, the P-type impurity layers PIL2 are formed in the terminal portions TMP of the polysilicon resistor PR in the R region RR. First, a mask film MSK7 that covers the resistance portion RSP in the R region RR, the LN region LNR and the HN region HNR and exposes the terminal portions TMP in the R region RR, the LP region LPR and the HP region HPR is formed over the main surface of the semiconductor substrate 1.

Then, a P-type impurity such as boron (B) is ion-implanted into the terminal portions TMP of the polysilicon resistor PR in the R region RR and the main surface of the semiconductor substrate 1 in the LP region LPR and the HP region HPR at a dose amount of $3.0E15/cm^2$ with using the mask film MSK7 to form the semiconductor regions PSD.

In the R region RR, regions with a resistance lower than that of the resistance portion RSP are formed in the terminal portions TMP of the polysilicon resistor PR.

Also, in the LP region LPR, the semiconductor regions PSD are formed in self-alignment with the low breakdown voltage gate electrode LGP and the sidewall insulating films SW. Namely, the semiconductor regions PSD are formed in the regions sandwiched between the sidewall insulating films SW and the element isolation regions STI at both ends of the low breakdown voltage gate electrode LGP and the sidewall insulating films SW. Thus, each of the source/drain regions of the low breakdown voltage P-type transistor LTP includes the semiconductor region EXP and the semiconductor region PSD.

In addition, in the HP region HPR, the semiconductor regions PSD are formed in self-alignment with the high breakdown voltage gate electrode HGP and the sidewall insulating films SW. Namely, the semiconductor regions PSD are formed in the regions sandwiched between the sidewall insulating films SW and the element isolation regions STI at both ends of the high breakdown voltage gate electrode HGP and the sidewall insulating films SW. Thus, each of the source/drain regions of the high breakdown voltage P-type transistor HTP includes the semiconductor region PLD and the semiconductor region PSD.

Next, a process of "formation of silicide layer SL" (step S11) shown in FIG. 1 is performed.

Figure 12:
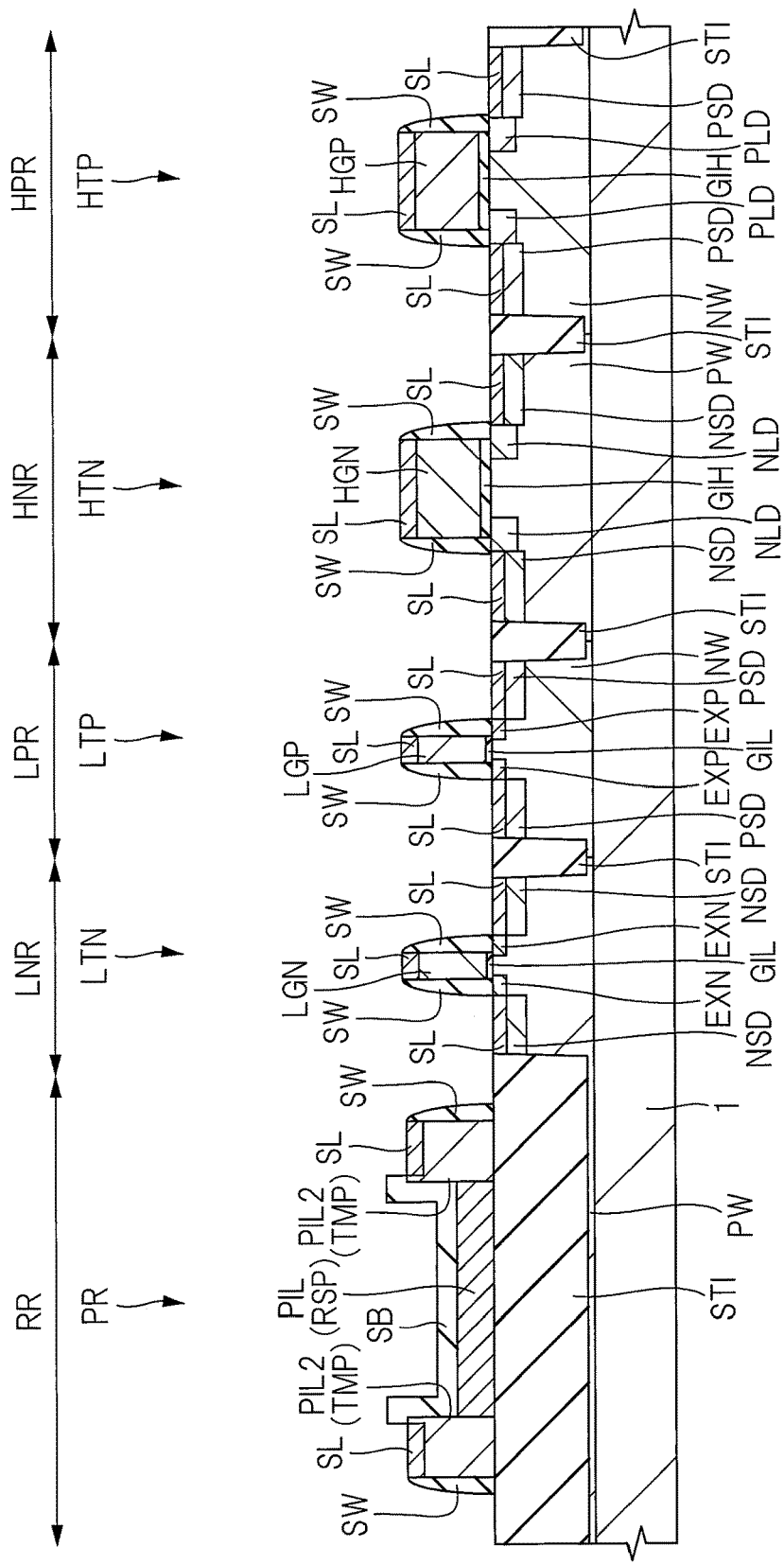
FIG. 12 is a cross-sectional view showing a principal part of the semiconductor device in the manufacturing process continued from FIG. 11.

As shown in FIG. 12, the insulating film SB serving as a mask film that selectively covers the resistance portion RSP of the polysilicon resistor PR in the R region RR and exposes the terminal portions TMP, the LN region LNR, the LP region LPR, the HN region HNR and the HP region HPR is formed, and the silicide layer SL is formed in each region exposed from the insulating film SB. The silicide layer SL is formed on each surface (upper surface) of the terminal portions TMP of the polysilicon resistor PR, the semiconductor regions NSD of the low breakdown voltage N-type transistor LTN and the low breakdown voltage gate electrode LGN and on each surface (upper surface) of the semiconductor regions PSD of the low breakdown voltage P-type transistor LTP and the low breakdown voltage gate electrode LGP. The silicide layer SL is further formed on each surface (upper surface) of the semiconductor regions NSD of the high breakdown voltage N-type transistor HTN and the high breakdown voltage gate electrode HGN and on each surface (upper surface) of the semiconductor regions PSD of high low breakdown voltage P-type transistor HTP and the high breakdown voltage gate electrode HGP.

Note that the silicide layer SL is comprised of, for example, a cobalt silicide (CoSi) layer, a nickel silicide (NiSi) layer or a platinum-containing (Pt-containing) nickel silicide (NiSi) layer.

Next, a process of "formation of plug electrode PG and wiring WL" (step S12) shown in FIG. 1 is performed.

As shown in FIG. 13, the interlayer insulating film IF that covers the polysilicon resistor PR, the low breakdown voltage N-type transistor LTN, the low breakdown voltage P-type transistor LTP, the high breakdown voltage N-type transistor HTN and the high breakdown voltage P-type transistor HTP is formed over the main surface of the semiconductor substrate 1. The interlayer insulating film IF is comprised of an insulating film (inorganic insulating film) such as a silicon oxide film, a silicon nitride film or a stacked film of a silicon nitride film and a silicon oxide film formed on the silicon nitride film. The openings in the interlayer insulating film IF partially expose each upper surface (surface) of the silicide layers SL formed on the surfaces of the semiconductor regions PSD and NSD and the terminal portions TMP.

Next, the plug electrode PG comprised of a metal film is formed in each of the openings in the interlayer insulating film IF. The plug electrode PG has a stacked structure of a barrier film such as a tungsten nitride (WN) film or a titanium nitride (TiN) film, and a tungsten (W) film. The barrier film is formed on the surface of the silicide layer SL and the side surface of the opening, and the tungsten film is formed on the barrier film.

Next, the plurality of wirings WL are formed on the upper surface of the interlayer insulating film IF so as to be in contact with the plug electrodes PG. Each of the plurality of wirings WL is a metal film mainly comprised of an aluminum (Al) film or a copper (Cu) film, but may contain a trace amount of impurity. For example, the metal film includes an aluminum film containing copper or silicon and a copper film containing palladium.

Through the processes described above, the semiconductor device shown in FIG. 13 is completed.

Main characteristics of the manufacturing method of the semiconductor device according to the present embodiment will be described below.

The manufacturing method of the semiconductor device according to the present embodiment includes a process in which a P-type impurity is ion-implanted into the HP region HPR at a first dose amount to form the P$^-$ semiconductor regions PLD of the high breakdown voltage P-type transistor HTP and a process in which a P-type impurity is ion-implanted into the LN region LNR and the R region RR at a second dose amount to form the P$^-$ semiconductor regions EXP of the low breakdown voltage P-type transistor LTP and the P-type impurity layer PIL of the polysilicon resistor PR, The manufacturing method further includes a process in which the resistance portion RSP of the polysilicon resistor PR is made thinner than each of the terminal portions TMP, and the second dose amount is larger than the first dose amount.

Namely, the polysilicon resistor PR with less temperature dependence can be obtained by forming the polysilicon resistor PR by implanting a P-type impurity at a relatively high concentration to the resistance portion RSP, and an occupied area of the polysilicon resistor PR can be reduced by thinning the resistance portion RSP. In other words, it is possible to improve the reliability of the semiconductor device and further to achieve the higher integration.

Also, the occupied area of the polysilicon resistor PR can be reduced by forming the polysilicon resistor PR by implanting a P-type impurity into the resistance portion RSP in comparison with the case of implanting an N-type impurity. This is because mobility of a P-type impurity is lower than that of an N-type impurity.

In addition, since the resistance portion RSP is selectively thinned and the terminal portions TMP are not thinned, the depth of the openings formed in the interlayer insulating film IF to form the plug electrodes PG connected to the terminal portions TMP can be reduced, so that the manufacturing yield can be improved.

The manufacturing method of the semiconductor device according to the present embodiment further includes a process in which the silicide layer SL is formed on each surface of the terminal portions TMP of the polysilicon resistor PR, Therefore, the contact resistance with the plug electrode PG connected to the terminal portion TMP can be reduced.

Second Embodiment

The second embodiment is a modified example of the manufacturing method of the semiconductor device according to the first embodiment described above, and only the difference from the first embodiment will be described below.

The polysilicon resistor PR is thinned in the process of "formation of resistance portion RSP" (step S7) shown in FIG. 1 in the first embodiment, but a polysilicon resistor PR1 has a stacked structure of an N-type impurity layer and a P-type impurity layer in the second embodiment.

Although the manufacturing method of the semiconductor device according to the second embodiment also follows the process flow diagram shown in FIG. 1, the process of "formation of resistance portion RSP" (step S7) is not present in the second embodiment. Further, the manufacturing method of the semiconductor device according to the second embodiment is different from the manufacturing method of the semiconductor device according to the first embodiment in the process of "formation of N⁻ semiconductor region NLD" (step S3) and the process of "formation of p⁻ semiconductor region EXP" (step S6).

Figure 14:
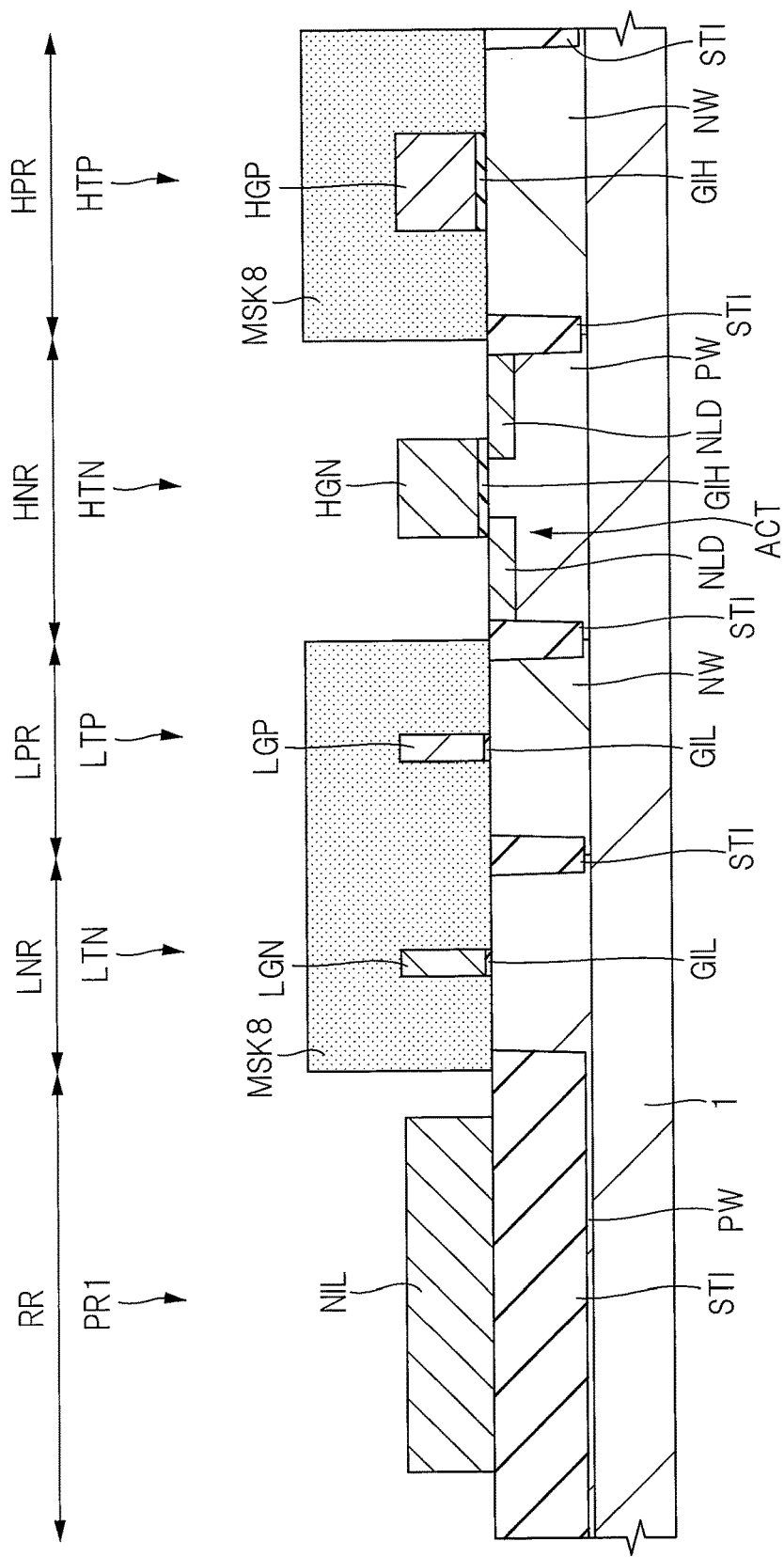
FIG. 14 is a cross-sectional view showing a principal part of a semiconductor device in a manufacturing process according to a second embodiment.
Figure 15:
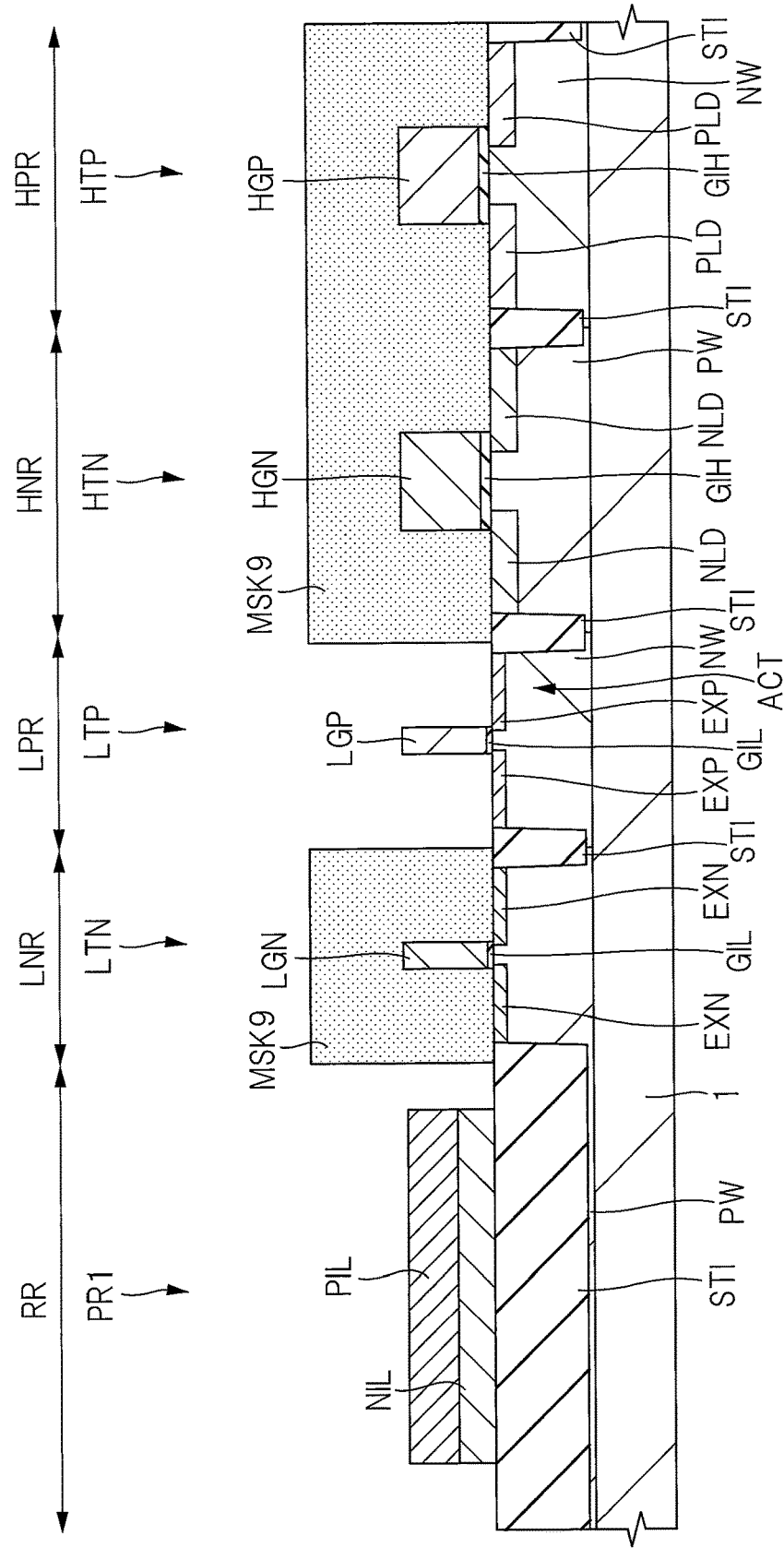
FIG. 15 is a cross-sectional view showing a principal part of the semiconductor device in the manufacturing process according to the second embodiment.
Figure 16:
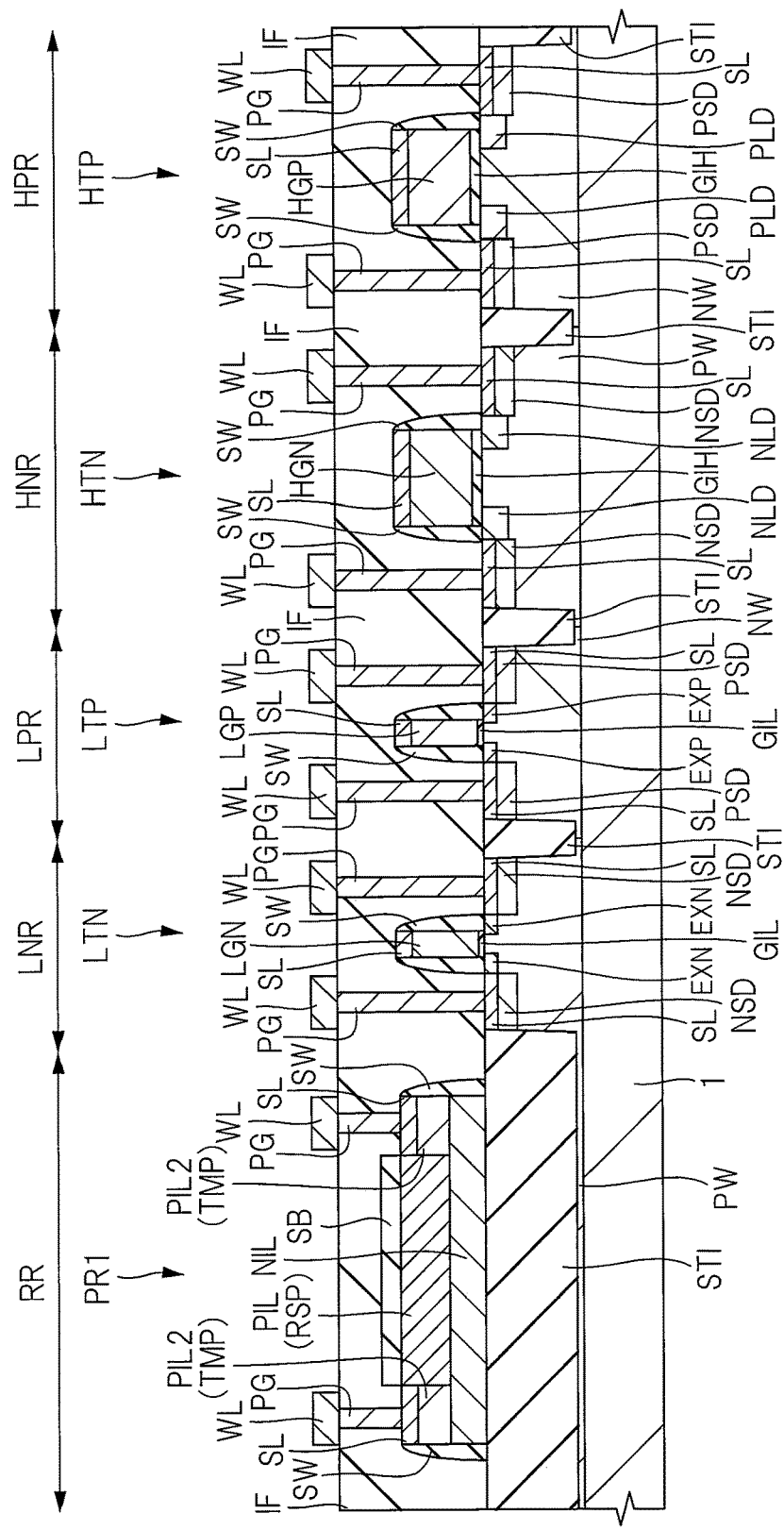
FIG. 16 is a cross-sectional view showing a principal part of the semiconductor device according to the second embodiment.

FIG. 14 and FIG. 15 are cross-sectional views each showing a principal part of the semiconductor device in the manufacturing process according to the second embodiment, and FIG. 16 is a cross-sectional view showing a principal part of the semiconductor device according to the second embodiment. FIG. 14 corresponds to FIG. 4 and is used to describe the process of "formation of N⁻ semiconductor region NLD" (step S3) shown in FIG. 1, FIG. 15 corresponds to FIG. 7 and is used to describe the process of "formation of P⁻ semiconductor region EXP" (step S6) shown in FIG. 1, and FIG. 16 corresponds to FIG. 13.

As shown in FIG. 14, in the process of "formation of N⁻ semiconductor region NLD" (step S3) shown in FIG. 1, a mask film MSK8 that covers the LN region LNR, the LP region LPR and the HP region HPR and exposes the R region RR and the HN region HNR is formed. Then, an N-type impurity such as phosphorus (P) is ion-implanted into the main surface of the semiconductor substrate 1 in the HN region HNR at a dose amount of $5.0E13/cm^2$ with using the mask film MSK8 to form the semiconductor regions NLD similarly to the first embodiment. At the same time, in the R region RR, the similar ion implantation is performed to the silicon film constituting the polysilicon resistor PR1 to form an N-type impurity layer NIL in the polysilicon resistor PR1.

As shown in FIG. 15, in the process of "formation of p⁻ semiconductor region EXP" (step S6) shown in FIG. 1, a P-type impurity layer PIL is formed on the surface of the N-type impurity layer NIL of the polysilicon resistor PR1 in the R region RR, so that the polysilicon resistor PR1 has the stacked structure of the N-type impurity layer NIL and the P-type impurity layer PIL.

Thereafter, by performing the processes subsequent to the step S8 shown in FIG. 1, the polysilicon resistor PR1 shown in FIG. 16 is completed. The polysilicon resistor PR1 includes the P-type impurity layer PIL formed on the N-type impurity layer NIL, and the P-type impurity layer PIL constitutes the resistance portion RSP. Also, terminal portions TMP each comprised of the P-type impurity layer PIL2 and the silicide layer SL are formed at both ends of the resistance portion RSP.

In the second embodiment, a thickness of the polysilicon resistor PR1 is equal to those of the low breakdown voltage gate electrodes LGN and LGP and the high breakdown voltage gate electrodes HGN and HGP. Also, the polysilicon resistor PR1 has the stacked structure of the N-type impurity layer NIL and the P-type impurity layer PIL.

Also in the second embodiment, the polysilicon resistor PR1 with less temperature dependence can be obtained similarly to the first embodiment described above. Further, since the polysilicon resistor PR1 is formed to have the stacked structure of the N-type impurity layer NIL and the P-type impurity layer PIL, it is possible to reduce the occupied area of the polysilicon resistor PR1.

In addition, since the process of "formation of resistance portion RSP" (step S7) shown in FIG. 1 can be omitted in comparison with the first embodiment, it is possible to achieve the reduction in the manufacturing cost and the improvement in the manufacturing yield.

Third Embodiment

The third embodiment is a modified example of the manufacturing method of the semiconductor device according to the first embodiment described above, and only the difference from the first embodiment will be described below.

Although the manufacturing method of the semiconductor device according to the third embodiment also follows the process flow diagram shown in FIG. 1, the order of the process of "formation of resistance portion RSP" (step S7) and the process of "formation of sidewall insulating film SW" (step S8) is reversed in the third embodiment. Namely, the process of "formation of resistance portion RSP" (step S7) is performed after the process of "formation of sidewall insulating film SW" (step S8).

Figure 17:
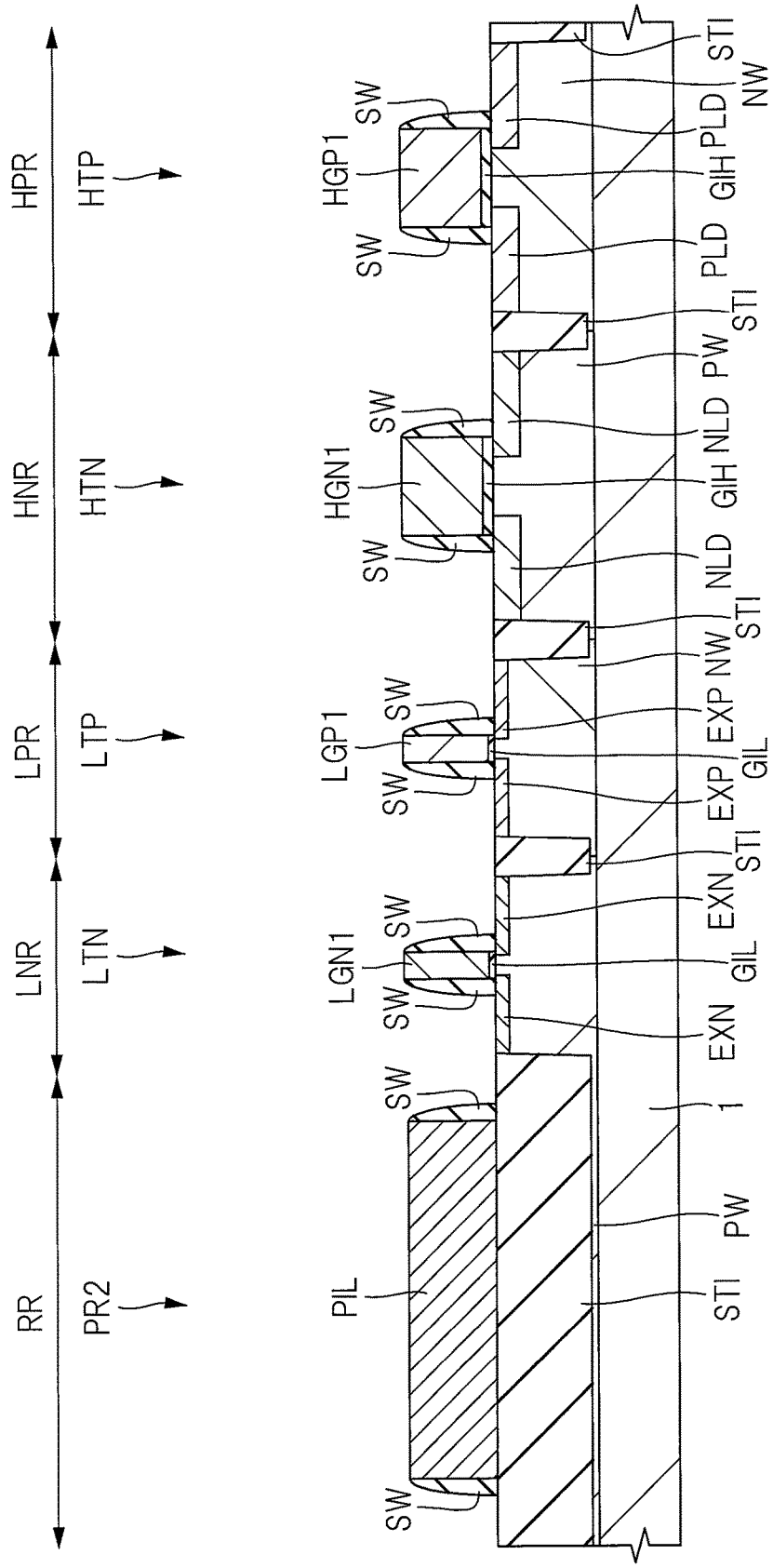
FIG. 17 is a cross-sectional view showing a principal part of a semiconductor device in a manufacturing process according to a third embodiment.
Figure 18:
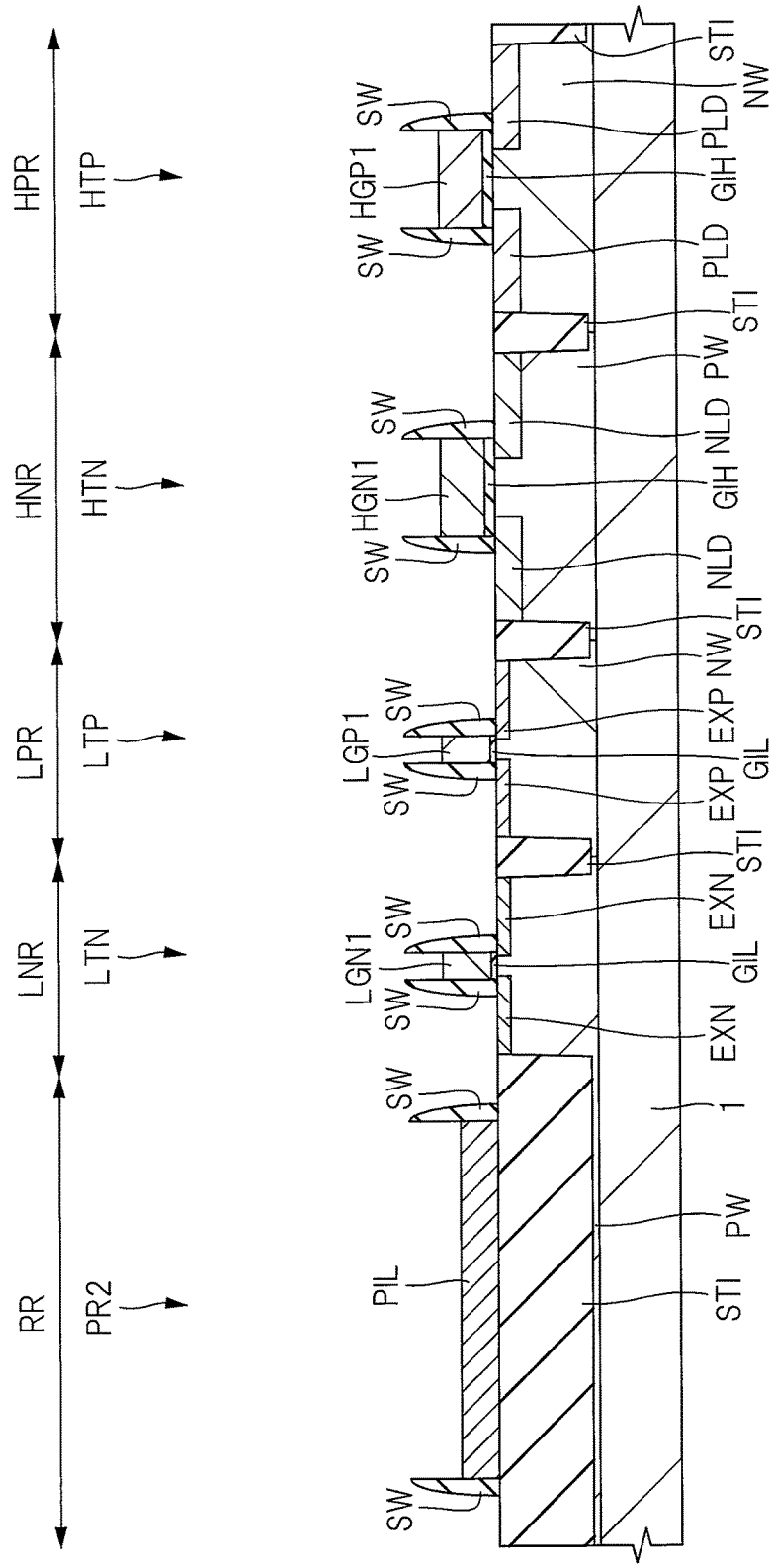
FIG. 18 is a cross-sectional view showing a principal part of the semiconductor device in the manufacturing process according to the third embodiment.
Figure 19:
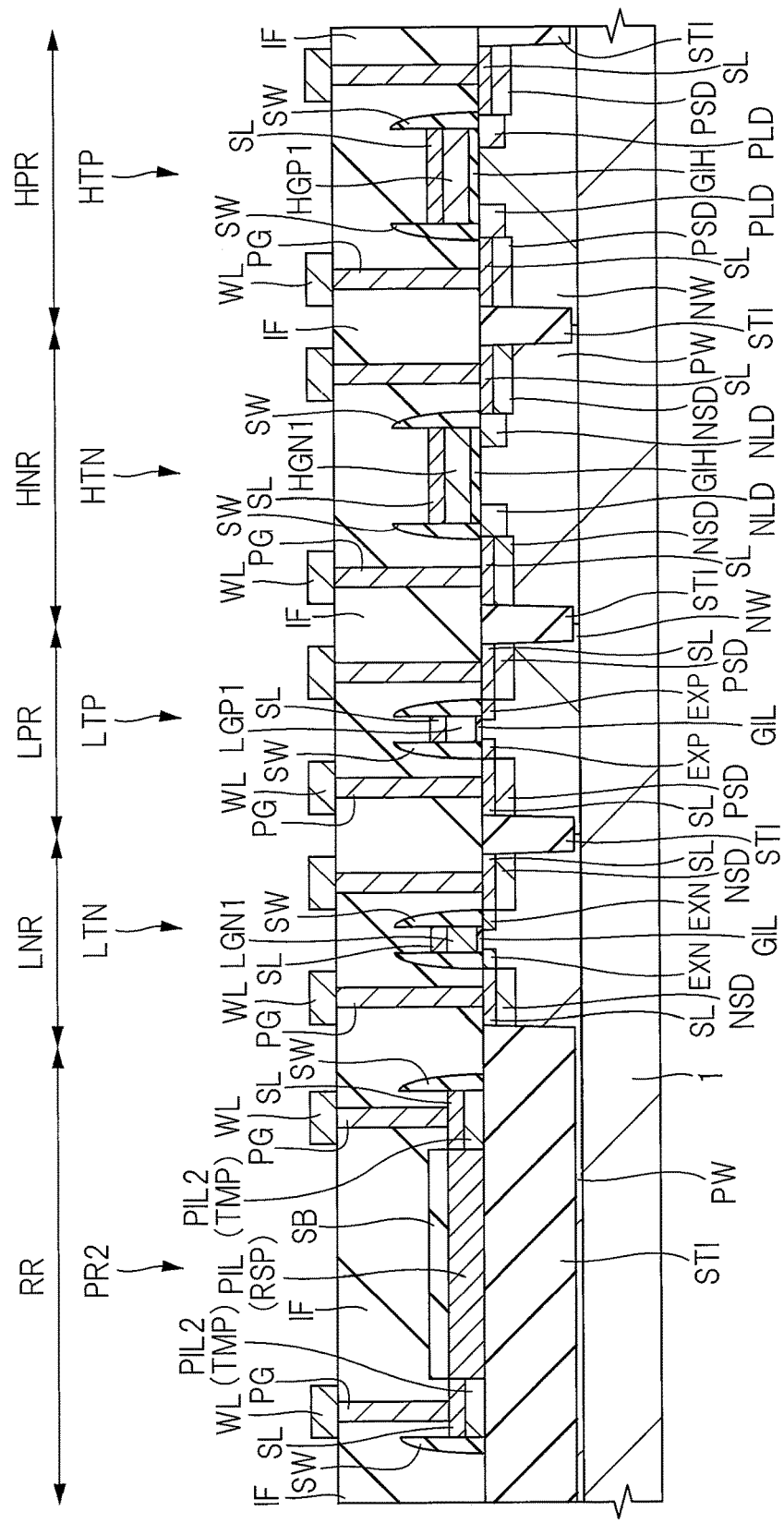
FIG. 19 is a cross-sectional view showing a principal part of the semiconductor device according to the third embodiment.

FIG. 17 and FIG. 18 are cross-sectional views each showing a
principal part of the semiconductor device in the manufacturing process according to the third embodiment, and FIG. 19 is a cross-sectional view showing a principal part of the semiconductor device according to the third embodiment. FIG. 17 corresponds to FIG. 9 and is used to describe the process of "formation of sidewall insulating film SW" (step S8) shown in FIG. 1, FIG. 18 corresponds to FIG. 8 and is used to describe the process of "formation of resistance portion RSP" (step S7) shown in FIG. 1, and FIG. 19 corresponds to FIG. 13.

As shown in FIG. 17, in the process of "formation of sidewall insulating film SW" (step S8) shown in FIG. 1, a polysilicon resistor PR2 is not thinned and thus has an overall uniform thickness, and the sidewall insulating films SW are formed on sidewalls of the polysilicon resistor PR2.

Next, the process of "formation of resistance portion RSP" (step S7) shown in FIG. 1 is performed. As shown in FIG. 18, the thickness of each of the polysilicon resistor PR2, the low breakdown voltage gate electrodes LGN and LGP and the high breakdown voltage gate electrodes HGN and HGP is reduced by etching. Accordingly, the main surface (upper surface) of the polysilicon resistor PR2 is lower than tip ends of the sidewall insulating films SW. In other words, the main surface (upper surface) of the polysilicon resistor PR2 is located on a side closer to the main surface of the semiconductor substrate 1 than the tip ends of the sidewall insulating films SW. The similar relation is applied also between the low breakdown voltage gate electrodes LGN and LGP and the sidewall insulating films SW on the sidewalls thereof and between the high breakdown voltage gate electrodes HGN and HGP and the sidewall insulating films SW on the sidewalls thereof.

Thereafter, by performing the processes subsequent to the step S9 shown in FIG. 1, the polysilicon resistor PR2 shown in FIG. 19 is completed. The polysilicon resistor PR2 includes the resistance portion RSP comprised of the P-type impurity layer PIL and the terminal portions TMP each comprised of the P-type impurity layer PIL2 and the silicide layer SL formed at both ends of the resistance portion RSP.

In the third embodiment, the thickness of the polysilicon resistor PR2 is equal to those of the low breakdown voltage gate electrodes LGN and the LGP and the high breakdown voltage gate electrodes HGN and HGP. Also, the upper surface of the resistance portion RSP of the polysilicon resistor PR2 (interface between the resistance portion RSP and the insulating film SB) is lower than the tip ends of the sidewall insulating films SW formed on the sidewalls of the polysilicon resistor PR2.

According to the third embodiment, since the mask film in the process of "formation of resistance portion RSP" (step S7) can be omitted, it is possible to achieve the reduction in the manufacturing cost.

Fourth Embodiment

Figure 20:
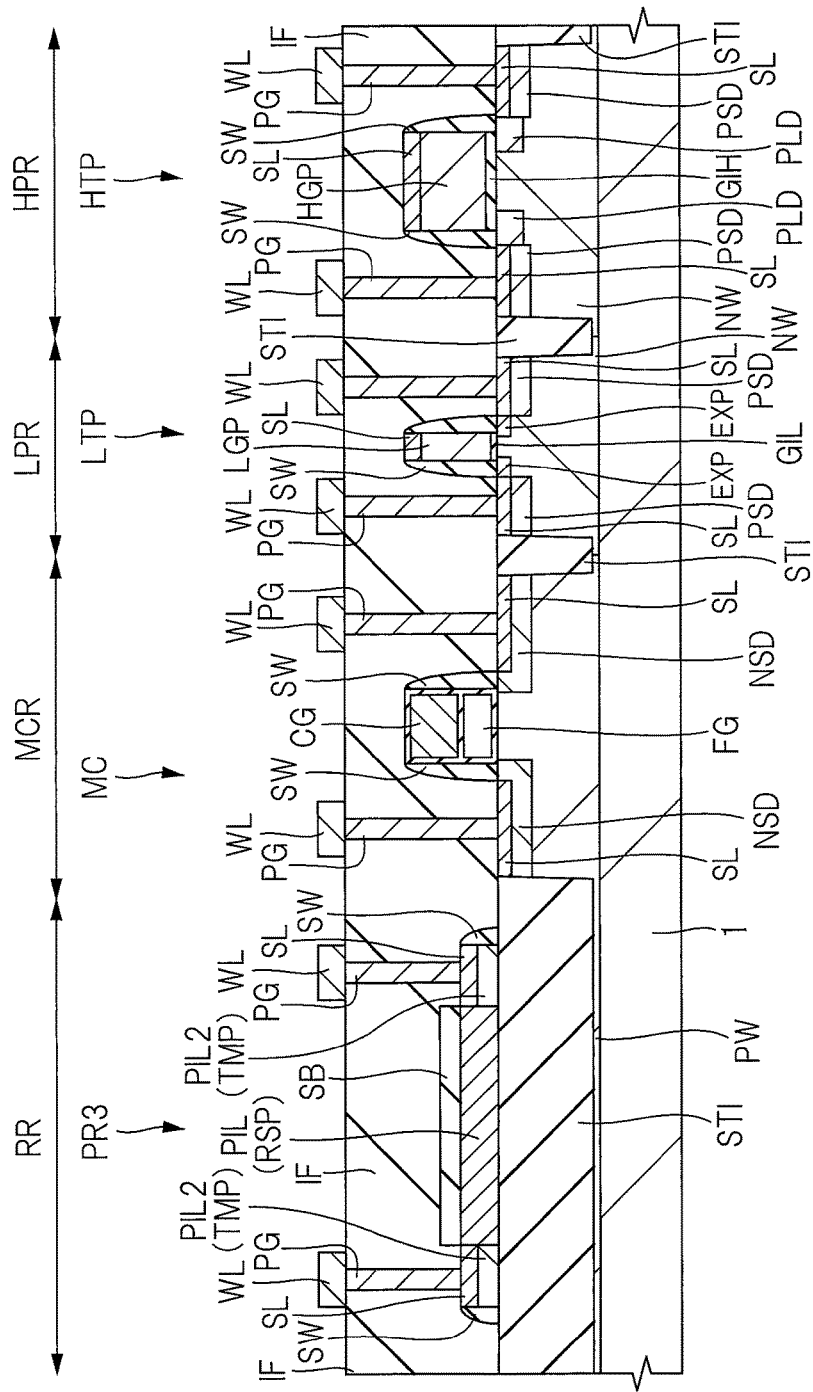
FIG. 20 is a cross-sectional view showing a principal part of a semiconductor device according to a fourth embodiment.

FIG. 20 is a cross-sectional view showing a principal part of a semiconductor device according to the fourth embodiment.

The semiconductor device according to the fourth embodiment includes a memory cell MC, the low breakdown voltage P-type transistor LTP, the high breakdown voltage P-type transistor HTP and a polysilicon resistor PR3.

The structure and the manufacturing method of the low breakdown voltage P-type transistor LTP and the high breakdown voltage P-type transistor HTP of the fourth embodiment are the same as those of the low breakdown voltage P-type transistor LTP and the high breakdown voltage P-type transistor HTP of the first embodiment.

The memory cell MC is a floating-gate nonvolatile memory and includes a floating gate electrode FG for accumulating charges, a control gate electrode CG and $N^+$ semiconductor regions NSD to be source/drain regions disposed on both sides of the stacked floating gate electrode FG and control gate electrode CG. In this case, the floating gate electrode FG and the control gate electrode CG are comprised of a silicon film (polysilicon film, polycrystalline silicon film), and a thickness of the floating gate electrode FG is smaller than that of the control gate electrode CG and is smaller than those of the low breakdown voltage gate electrode LGP and the high breakdown voltage gate electrode HGP.

The polysilicon resistor PR3 includes the P-type impurity layer PIL comprised of a silicon film (polysilicon film, polycrystalline silicon film) and constituting the resistance portion RSP and the P-type impurity layer PIL2 and the silicide layer SL constituting the terminal portions TMP. Similarly to the first embodiment, the P-type impurity layer PIL of the silicon resistor PR3 is formed by the same ion implantation process as the P$^-$ semiconductor region EXP of the low breakdown voltage P-type transistor LTP, and the impurity concentration of the P-type impurity layer PIL is equal to the impurity concentration of the P$^-$ semiconductor region EXP of the low breakdown voltage P-type transistor LTP. Further, the thickness of the polysilicon resistor PR3 is equal to the thickness of the floating gate electrode FG.

Since a P-type impurity is implanted at a relatively high concentration to the resistance portion RSP of the polysilicon resistor PR3 similarly to the first embodiment, the polysilicon resistor PR3 with less temperature dependence can be obtained. Further, since the thickness of the polysilicon resistor PR3 is made equal to that of the relatively thin floating gate electrode FG, it is possible to reduce the occupied area of the polysilicon resistor PR3.

In the foregoing, the invention made by the inventor of the present invention has been concretely described based on the embodiments. However, it is needless to say that the present invention is not limited to the foregoing embodiments and various modifications and alterations can be made within the scope of the present invention.

What is claimed is:

1. A manufacturing method of a semiconductor device including a first transistor having a first gate electrode, a first source region and a first drain region, a second transistor having a second gate electrode, a second source region and a second drain region, and a polysilicon resistor having a resistance portion and a first terminal portion and a second terminal portion located at both ends of the resistance portion, the manufacturing method comprising the steps of:

(a) preparing a semiconductor substrate having on a main surface thereof a first region in which the first transistor is formed, a second region in which the second transistor is formed, and a third region in which the polysilicon resistor is formed;

(b) forming a first gate insulating film on the main surface of the semiconductor substrate in the first region and forming a second gate insulating film on the main surface of the semiconductor substrate in the second region;

(c) forming a first polycrystalline silicon film for forming the first gate electrode on the first gate insulating film, forming a second polycrystalline silicon film for forming the second gate electrode on the second gate insulating film, and forming a third polycrystalline silicon film for forming the polysilicon resistor on the main surface of the semiconductor substrate in the third region;

(d) ion-implanting a first impurity of a first conductivity type into the first region by using a first mask film that exposes the first region and covers the second region and the third region, thereby forming first semiconductor regions in the main surface of the semiconductor substrate at both ends of the first gate electrode;

(e) ion-implanting a second impurity of the first conductivity type into the second region and the third region by using a second mask film that exposes the second region and the third region and covers the first region, thereby forming second semiconductor regions in the main surface of the semiconductor substrate at both ends of the second gate electrode and forming an impurity layer of the first conductivity type in the third polycrystalline silicon film;

(f) selectively etching the third polycrystalline silicon film to make a thickness of the third polycrystalline silicon film of the resistance portion smaller than a thickness of the third polycrystalline silicon film of the first terminal portion and the second terminal portion;

(g) ion-implanting a third impurity of the first conductivity type into the second region by using a third mask film that exposes the second region and covers the resistance portion of the third region, thereby forming third semiconductor regions in the main surface of the semiconductor substrate at both ends of the second gate electrode; and (h) connecting a first electrode and a second electrode to the first terminal portion and the second terminal portion, respectively, wherein the first semiconductor region constitutes the first source region or the first drain region, wherein the second semiconductor region and the third semiconductor region constitute the second source region or the second drain region, and wherein a dose amount of the second impurity is larger than a dose amount of the first impurity.

2. The manufacturing method of a semiconductor device according to claim 1, wherein the first conductivity type is a P-type.

3. The manufacturing method of a semiconductor device according to claim 1,
wherein a thickness of the first gate insulating film is larger than a thickness of the second gate insulating film.

4. The manufacturing method of a semiconductor device according to claim 3,
wherein a gate length of the first gate electrode in a direction connecting the first semiconductor regions at both ends of the first gate electrode is longer than a gate length of the second gate electrode in a direction connecting the second semiconductor regions at both ends of the second gate electrode.

5. The manufacturing method of a semiconductor device according to claim 1,
wherein, in the step (g), the third impurity is implanted to the first terminal portion and the second terminal portion of the polysilicon resistor, and
wherein a dose amount of the third impurity is larger than the dose amounts of the second impurity and the first impurity.

6. The manufacturing method of a semiconductor device according to claim 1, further comprising, between the step (f) and the step (g), a step of (i) forming sidewall insulating films on sidewalls of the first gate electrode and the second gate electrode.

7. The manufacturing method of a semiconductor device according to claim 6, further comprising, between the step (g) and the step (h), a step of (j) forming silicide layers on surfaces of the third semiconductor regions and surfaces of the first terminal portion and the second terminal portion.

8. A manufacturing method of a semiconductor device including a first transistor having a first gate electrode, a first source region and a first drain region, a second transistor having a second gate electrode, a second source region and a second drain region, a third transistor having a third gate electrode, a third source region and a third drain region, and a polysilicon resistor having a resistance portion and a first terminal portion and a second terminal portion located at both ends of the resistance portion, the manufacturing method comprising the steps of:
(a) preparing a semiconductor substrate having on a main surface thereof a first region in which the first transistor is formed, a second region in which the second transistor is formed, a third region in which the third transistor is formed, and a fourth region in which the polysilicon resistor is formed;
(b) forming a first gate insulating film on the main surface of the semiconductor substrate in the first region, forming a second gate insulating film on the main surface of the semiconductor substrate in the second region, and forming a third gate insulating film on the main surface of the semiconductor substrate in the third region;
(c) forming a first polycrystalline silicon film for forming the first gate electrode on the first gate insulating film, forming a second polycrystalline silicon film for forming the second gate electrode on the second gate insulating film, forming a third polycrystalline silicon film for forming the third gate electrode on the third gate insulating film, and forming a fourth polycrystalline silicon film for forming the polysilicon resistor on the main surface of the semiconductor substrate in the fourth region;
(d) ion-implanting a first impurity of a first conductivity type into the first region and the fourth region by using a first mask film that exposes the first region and the fourth region and covers the second region and the third region, thereby forming first semiconductor regions in the main surface of the semiconductor substrate at both ends of the first gate electrode and forming a first impurity layer in the fourth polycrystalline silicon film;
(e) ion-implanting a second impurity of a second conductivity type different from the first conductivity type into the second region by using a second mask film that exposes the second region and covers the first region, the third region and the fourth region, thereby forming second semiconductor regions in the main surface of the semiconductor substrate at both ends of the second gate electrode;
(f) ion-implanting a third impurity of the second conductivity type into the third region and the fourth region by using a third mask film that exposes the third region and the fourth region and covers the first region and the second region, thereby forming third semiconductor regions in the main surface of the semiconductor substrate at both ends of the third gate electrode and forming a second impurity layer on a surface of the first impurity layer of the fourth polycrystalline silicon film;
(g) forming sidewall insulating films on sidewalls of the third gate electrode;
(h) ion-implanting a fourth impurity of the second conductivity type into the third region and the fourth region by using a fourth mask film that exposes the third region and the first terminal portion and the second terminal portion of the polysilicon resistor and covers the resistance portion of the polysilicon resistor, thereby forming fourth semiconductor regions in the main surface of the semiconductor substrate at both ends of the third gate electrode and the sidewall insulating films and forming third impurity layers in the first terminal portion and the second terminal portion; and
(i) forming a first electrode and a second electrode connected to the first terminal portion and the second terminal portion, respectively,
wherein the first semiconductor region constitutes the first source region or the first drain region,
wherein the second semiconductor region constitutes the second source region or the second drain region,
wherein the third semiconductor region and the fourth semiconductor region constitute the third source region or the third drain region, and
wherein a dose amount of the third impurity is larger than a dose amount of the second impurity.

9. The manufacturing method of a semiconductor device according to claim 8,
wherein the first conductivity type is an N-type and the second conductivity type is a P-type.

10. The manufacturing method of a semiconductor device according to claim 8,
wherein the dose amount of the third impurity is larger than a dose amount of the first impurity.

11. The manufacturing method of a semiconductor device according to claim 8,
wherein a thickness of the second gate insulating film is larger than a thickness of the third gate insulating film.

12. The manufacturing method of a semiconductor device according to claim 11,
wherein a gate length of the second gate electrode in a direction connecting the second semiconductor regions at both ends of the second gate electrode is longer than a gate length of the third gate electrode in a direction connecting the third semiconductor regions at both ends of the third gate electrode.

13. The manufacturing method of a semiconductor device according to claim 8, further comprising, between the step (h) and the step (i), a step of (j) forming silicide layers on surfaces of the first terminal portion and the second terminal portion, while covering the resistance portion of the polysilicon resistor with the fourth mask film.

14. A manufacturing method of a semiconductor device including a first transistor having a first gate electrode, a first source region and a first drain region, a second transistor having a second gate electrode, a second source region and a second drain region, and a polysilicon resistor having a resistance portion and a first terminal portion and a second terminal portion located at both ends of the resistance portion, the manufacturing method comprising the steps of:
  (a) preparing a semiconductor substrate having on a first main surface thereof a first region in which the first transistor is formed, a second region in which the second transistor is formed, and a third region in which the polysilicon resistor is formed;
  (b) forming a first gate insulating film on the first main surface of the semiconductor substrate in the first region and forming a second gate insulating film on the first main surface of the semiconductor substrate in the second region;
  (c) forming a first polycrystalline silicon film for forming the first gate electrode on the first gate insulating film, forming a second polycrystalline silicon film for forming the second gate electrode on the second gate insulating film, and forming a third polycrystalline silicon film for forming the polysilicon resistor on the first main surface of the semiconductor substrate in the third region;
  (d) ion-implanting a first impurity of a first conductivity type into the first region by using a first mask film that exposes the first region and covers the second region and the third region, thereby forming first semiconductor regions in the first main surface of the semiconductor substrate at both ends of the first gate electrode;
  (e) ion-implanting a second impurity of the first conductivity type into the second region and the third region by using a second mask film that exposes the second region and the third region and covers the first region, thereby forming second semiconductor regions in the first main surface of the semiconductor substrate at both ends of the second gate electrode and forming an impurity layer of the first conductivity type in the third polycrystalline silicon film;
  (f) forming sidewall insulating films whose tip ends have a height equal to that of a second main surface of each of the first polycrystalline silicon film, the second polycrystalline silicon film and the third polycrystalline silicon film, on sidewalls of the first polycrystalline silicon film, the second polycrystalline silicon film and the third polycrystalline silicon film;
  (g) etching the first polycrystalline silicon film, the second polycrystalline silicon film and the third polycrystalline silicon film, thereby forming a third main surface lower than the tip ends of the sidewall insulating films on each of the first polycrystalline silicon film, the second polycrystalline silicon film and the third polycrystalline silicon film;
  (h) ion-implanting a third impurity of the first conductivity type into the second region by using a third mask film that exposes the second region and covers the resistance portion of the third region, thereby forming third semiconductor regions in the first main surface of the semiconductor substrate at both ends of the second gate electrode; and
  (i) connecting a first electrode and a second electrode to the first terminal portion and the second terminal portion, respectively,
 wherein the first semiconductor region constitutes the first source region or the first drain region,
 wherein the second semiconductor region and the third semiconductor region constitute the second source region or the second drain region, and
 wherein a dose amount of the second impurity is larger than a dose amount of the first impurity.

15. The manufacturing method of a semiconductor device according to claim 14,
 wherein the first conductivity type is a P-type.

* * * * *